United States Patent
Achtenberg et al.

(10) Patent No.: US 10,911,069 B2
(45) Date of Patent: Feb. 2, 2021

(54) MEMORY DEVICE WITH ENHANCED ERROR CORRECTION

(71) Applicant: Western Digital Technologies, Inc., San Jose, CA (US)

(72) Inventors: Stella Achtenberg, Kfar Saba (IL); Omer Fainzilber, Kfar Saba (IL); Dudy David Avraham, Kfar Saba (IL)

(73) Assignee: Western Digital Technologies, Inc., San Jose, CA (US)

(*) Notice: Subject to any disclaimer, the term of this patent is extended or adjusted under 35 U.S.C. 154(b) by 40 days.

(21) Appl. No.: 16/254,575

(22) Filed: Jan. 22, 2019

(65) Prior Publication Data
US 2020/0235757 A1    Jul. 23, 2020

(51) Int. Cl.
*H03M 13/00* (2006.01)
*H03M 13/37* (2006.01)
*G06F 11/10* (2006.01)

(52) U.S. Cl.
CPC ..... *H03M 13/3723* (2013.01); *G06F 11/1076* (2013.01)

(58) Field of Classification Search
CPC .......... H03M 13/3723; H03M 13/2927; G06F 11/1076
See application file for complete search history.

(56) References Cited

U.S. PATENT DOCUMENTS

| | | | | | |
|---|---|---|---|---|---|
| 5,638,384 | A | * | 6/1997 | Hayashi | H04L 1/0007 714/752 |
| 5,673,296 | A | * | 9/1997 | Ohgane | H04J 3/0608 370/512 |
| 7,352,811 | B2 | * | 4/2008 | Stone | H04N 19/176 375/240.03 |
| 10,116,419 | B2 | * | 10/2018 | Lu | H03M 13/3746 |
| 10,630,430 | B2 | * | 4/2020 | Kalhan | H04L 5/0055 |

* cited by examiner

*Primary Examiner* — Esaw T Abraham
(74) *Attorney, Agent, or Firm* — Vierra Magen Marcus LLP

(57) ABSTRACT

Disclosed herein are memory devices, systems, and methods of content-aware decoding of encoded data. In one aspect, an encoded data chunk is received and one or more characteristics, such as source statistics, are determined. A similar data chunk (that may, e.g., contain data of a similar type) with comparable statistics may be sought. The similar data chunk may, for example, have source statistics that are positively correlated to the source statistics of the encoded data chunk to be decoded. Decoder parameters for the encoded data may be set to correspond with decoder parameters suited to the similar data chunk. The encoded data chunk is decoded using the new decoder parameters. Decoding encoded data based on content can enhance performance, reducing decoding latency and/or power consumption.

12 Claims, 15 Drawing Sheets

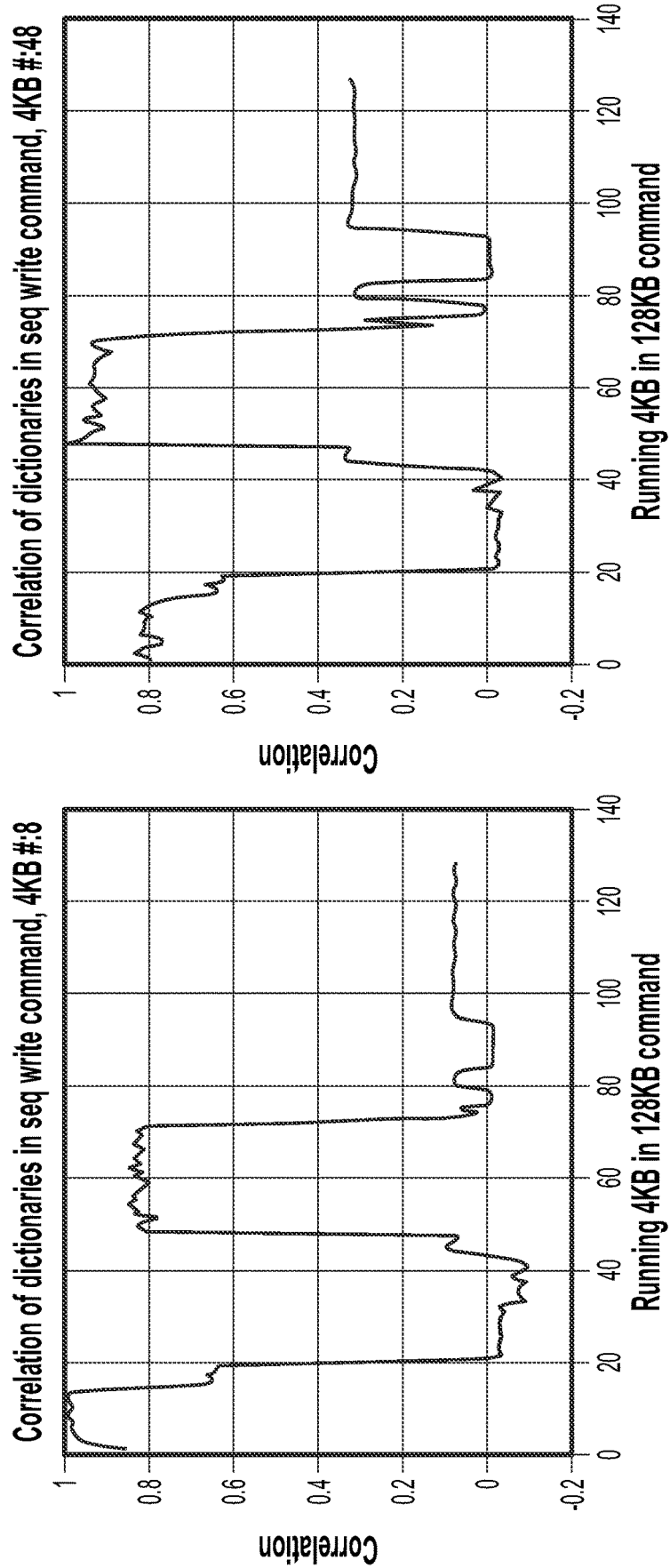

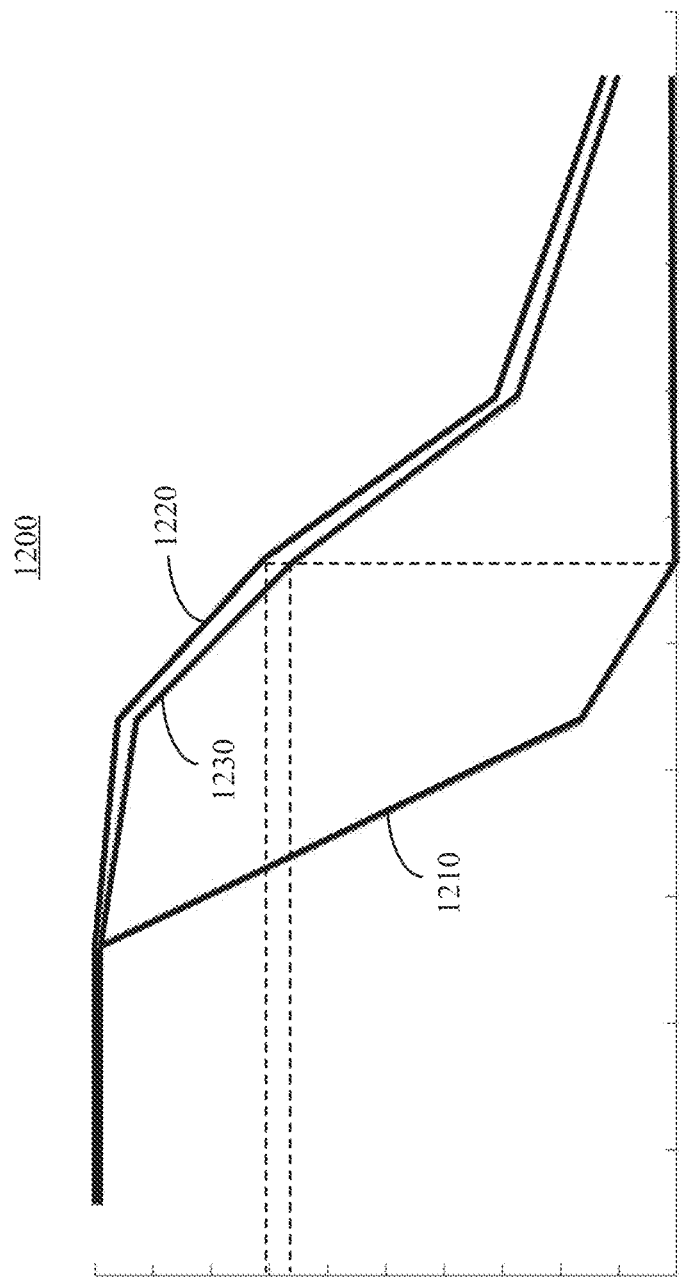

MEMORY DEVICE WITH ENHANCED ERROR CORRECTION

BACKGROUND

The following description is provided to assist the understanding of the reader. None of the information provided or references cited are admitted to be prior art.

Electronic data stored in computer memory devices can suffer, to varying degrees, from data corruption that introduces unintended errors to data during writing, reading, storing, transmitting, or processing. Data corruption can result in loss of valuable data and system crashes. A controller associated with a memory device may employ error correction code (ECC) decoders to manage data errors. ECC decoders, such as a low-density parity-check (LDPC) decoder, may base error correction on the probability that each bit has flipped (e.g., that a one should be a zero or vice-versa). An ECC decoder that uses default parameters (which may correspond to the case of uniform distribution of data) is not as efficient as a decoder that uses decode parameters more suited to non-uniform data being decoded. But estimating probabilities of bit flips based on features of the noisy data (i.e., the encoded data read from memory and with potential bit flips) to be decoded may lead to a wrong estimation because the noisy data may have a high number of bit flips. Adjusting the decoder parameters according to wrong estimated statistics can increase decoding latency and power consumption and could lead to a decode failure.

SUMMARY

Embodiments disclosed herein relate to devices, systems, and methods for decoding data based on source statistics. In one aspect, the likelihood that particular bits have flipped varies for different types of data, and performance of decoders is enhanced by knowing underlying source statistics of the encoded data. In another aspect, a decoder adjusts its estimation for each bit based on information on type of data, enhancing correction capability and reducing decoding latency and power consumption.

Various embodiments disclosed herein are related to a device. The memory device may include a controller. The controller may be configured to compute a first source statistic for a first data chunk. The first data chunk may be a first error correction code (ECC)-encoded data chunk. The controller may also be configured to compare the first source statistic to a second source statistic for a second data chunk. The second data chunk may be a second ECC-encoded data chunk. The controller may moreover be configured to determine decoder parameters for the first data chunk based on at least one of the first and the second source statistics. The decoder parameters may be ECC decoder parameters. The controller may be configured to determine decoder parameters in response to determining a positive correlation between the first source statistic and the second source statistic. The memory device may also comprise a decoder. The decoder may be an ECC decoder. The decoder may be configured to decode the first data chunk using the decoder parameters determined by the controller.

In one or more embodiments, the first data chunk and the second data chunk both include data of a first type. The first type may correspond to an application that generated the data.

In one or more embodiments, the controller may be configured to compute the first source statistic without decoding the first data chunk.

In one or more embodiments, the memory device may further comprise an encoder. The encoder may be an ECC encoder. The encoder may be configured to encode data to generate the second data chunk. The controller may be configured to compute the second source statistic during encoding of the second data chunk by the encoder.

In one or more embodiments, the controller may be configured to determine the decoder parameters for the first data chunk by, at least in part, identifying decoder parameters suited to the second data chunk. The controller may be configured to determine the decoder parameters in response to a determination that the first source statistic is positively correlated to the second source statistic.

In one or more embodiments, to compare the first source statistic to the second source statistic, the controller may be configured to, at least in part, compute a correlation coefficient between the first source statistic and the second source statistic. The controller may also be configured to compare the correlation coefficient to a correlation threshold. The controller may additionally be configured to determine the first source statistic is positively correlated to the second source statistic. The controller may be configured to determine the first source statistic is positively correlated to the second source statistic in response to the correlation coefficient satisfying the correlation threshold.

In one or more embodiments, the decoder may be configured to receive and decode the second data chunk prior to receipt and decoding of the first data chunk.

In one or more embodiments, the controller may be configured to select the second data chunk independent of a physical location of the second data chunk in the memory device.

In one or more embodiments, the controller may be configured to select the second data chunk independent of when the second data chunk was encoded relative to the first data chunk.

In one or more embodiments, the first source statistic may be selected from a group consisting of a byte histogram, a bit histogram, and a repetition of variable length sequences.

Various embodiments disclosed herein are related to a system. The system may comprise a plurality of memory cells storing encoded data chunks containing data generated by a plurality of application types. The system may also comprise a memory interface circuit coupled to the plurality of memory cells. The memory interface circuit may be configured to receive a first encoded data chunk stored in the plurality of memory cells. The first encoded data chunk may be a first ECC-encoded data chunk. The first encoded data chunk may contain data generated by a first application type. The memory interface circuit may also be configured to compare a first source statistic for the first encoded data chunk to a plurality of classes of source statistics corresponding to data generated by a plurality of corresponding application types. The memory interface circuit may additionally be configured to identify a first class of source statistics that is positively correlated to the first source statistic based at least in part on application type. The memory interface circuit may further be configured to modify decoder parameters based on the first class of source statistics. The decoder parameters may be ECC decoder parameters. The system may also include a decoder coupled to the memory interface circuit. The decoder may be an ECC decoder. The decoder may be configured to decode the first encoded data chunk using the decoder parameters modified by the memory interface circuit.

In one or more embodiments, to identify the decoder parameters, the memory interface circuit may be configured to, at least in part, compute a correlation of the first source statistic with a second source statistic for a second encoded data chunk.

In one or more embodiments, the system may further comprise an encoder. The encoder may be configured to encode data written to the memory cells. The memory interface circuit may be further configured to determine the first source statistic during encoding of data to generate the first encoded data chunk.

In one or more embodiments, the memory interface circuit may be configured to identify the first class of source statistics as being positively correlated to the first source statistic. The memory interface circuit may be configured to identify the first class of source statistics as being positively correlated to the first source statistic in response to a correlation between the first class of source statistics and the first source statistic satisfying a correlation threshold.

In one or more embodiments, the decoder may be configured to apply the decoder parameters used to successfully decode a second encoded data chunk to the first encoded data chunk. The decoder may be configured to apply the decoder parameters used to successfully decode a second encoded data chunk to the first encoded data chunk in response to determining that the correlation exceeds the correlation threshold.

In one or more embodiments, the first application type generates data containing one or more types of data selected from a group consisting of text, images, videos, and audio.

Various embodiments disclosed herein are related to a method of decoding encoded data. The encoded data may be ECC-encoded data. The method may comprise determining a source statistic for an encoded data chunk. The encoded data chunk may be an ECC-encoded data chunk. The method may also comprise computing a first correlation of the source statistic with a first reference source statistic corresponding to a first reference encoded data chunk. The first reference encoded data chunk may be a first reference ECC-encoded data chunk. The method may additionally comprise comparing the first correlation to a correlation threshold. The method may further comprise decoding the encoded data chunk using decoding parameters previously used to decode the first reference encoded data chunk. The decoding parameters may be ECC decoding parameters. Decoding the encoded data chunk using decoding parameters previously used to decode the first reference encoded data chunk may be in response to determining that the first correlation satisfies the correlation threshold.

In one or more embodiments, the method may further comprise computing a second correlation of the source statistic with a second reference source statistic corresponding to a second reference encoded data chunk. The second reference encoded data chunk may be a second reference ECC-encoded data chunk. The encoded data may be decoded using decoding parameters previously used to decode the first reference encoded data chunk when both (i) the first correlation satisfies the correlation threshold and (ii) the first correlation is greater than the second correlation.

In one or more embodiments, the method may further comprise determining the source statistic for the encoded data chunk during encoding of data in the encoded data chunk to generate the encoded data chunk. Encoding of data may be ECC encoding.

In one or more embodiments, the method may further comprise determining that the first reference encoded data chunk was successfully decoded using the decoding parameters as a precondition for decoding the encoded data chunk using the decoding parameters.

In one or more embodiments, the method may further comprise determining that the encoded data chunk is not decoded successfully using the decoding parameters previously used to decode the first reference encoded data chunk. The method may further comprise decoding the encoded data chunk using a second set of decoding parameters. The second set of decoding parameters may be a second set of ECC decoding parameters.

In one or more embodiments, the second set of decoding parameters may have been previously used to decode the second reference encoded data chunk.

In one or more embodiments, the second set of decoding parameters may be default decoding parameters used to decode encoded data chunks when no correlation exceeding the correlation threshold is found.

In one or more embodiments, the method may further comprise determining that the first correlation satisfies the correlation threshold. Determining that the first correlation satisfies the correlation threshold may be in response to a determination that data in the encoded data chunk was generated by a same application type as data in the first reference encoded data chunk.

Various embodiments disclosed herein are related to a memory device. The memory device may comprise means for determining a source statistic for an encoded data chunk. The encoded data chunk may be an ECC-encoded data chunk. The memory device may also comprise means for computing a first correlation of the source statistic with a first reference source statistic corresponding to a first reference encoded data chunk. The first reference encoded data chunk may be a first reference ECC-encoded data chunk. The memory device may additionally comprise means for computing a second correlation of the source statistic with a second reference source statistic corresponding to a second reference encoded data chunk. The second reference encoded data chunk may be a second reference ECC-encoded data chunk. The memory device may further comprise means for comparing the first correlation to a correlation threshold. The memory device may furthermore comprise means for decoding the encoded data chunk using decoding parameters previously used to decode the first reference encoded data chunk. The decoding parameters may be ECC decoding parameters. The decoding the encoded data chunk using decoding parameters previously used to decode the first reference encoded data chunk may be in response to determining that the first correlation satisfies the correlation threshold.

Various embodiments disclosed herein relate to a controller. The controller may be configured to determine a first source statistic for a first data chunk. The first data chunk may be an ECC-encoded data chunk. The controller may also be configured to compare the first source statistic to a second source statistic. The second source statistic may be for a second data chunk. The second data chunk may be an ECC-encoded data chunk. The controller may moreover be configured to determine decoder parameters for the first data chunk based on at least one of the first and the second source statistics. The decoder parameters may be ECC decoder parameters. The controller may be configured to determine the decoder parameters in response to determining a positive correlation between the first source statistic and the second source statistic. The controller may additionally be configured to decode the first data chunk using the determined decoder parameters.

In one or more embodiments, the first data chunk and the second data chunk may both include data of a first type. The first type may correspond to an application that generated the data.

In one or more embodiments, the first data chunk may correspond to a first application. The second data chunk may correspond to a second application. The second application may be different from the first application. The first and second data chunks may both be of a first type. The first type may correspond to a user that generated the data. Alternatively or additionally, the first type may correspond to a file type.

In one or more embodiments, the controller may be configured to determine the first source statistic without decoding the first data chunk.

In one or more embodiments, the controller may be configured to encode data to generate the second data chunk. The controller may be configured to ECC encode the second data chunk. The controller may also be configured to determine the second source statistic during encoding of the second data chunk.

In one or more embodiments, the controller may be configured to determine the decoder parameters for the first data chunk by, at least in part, identifying decoder parameters suited to the second data chunk. The decoder parameters may be identified in response to a determination that the first source statistic is positively correlated to the second source statistic.

In one or more embodiments, to compare the first source statistic to the second source statistic, the controller may be configured to, at least in part, compute a correlation coefficient between the first source statistic and the second source statistic. The controller may also be configured to compare the correlation coefficient to a correlation threshold. The controller may moreover may configured to determine the first source statistic is positively correlated to the second source statistic. The controller may be configured to determine the first source statistic is positively correlated to the second source statistic in response to the correlation coefficient satisfying the correlation threshold.

In one or more embodiments, the controller may be configured to receive and decode the second data chunk prior to receipt and decoding of the first data chunk.

In one or more embodiments, the controller may be configured to select the second data chunk independent of a physical location of the second data chunk in a memory device.

In one or more embodiments, the controller may be configured to select the second data chunk independent of when the second data chunk was encoded relative to the first data chunk.

In one or more embodiments, the first source statistic may be based on a correlation in time. The correlation in time may be between when the first and second data chunks were encoded. The decoder parameters may be determined based on the first source statistic.

In one or more embodiments, the controller may be configured to modify the decoder parameters based on a correlation in time. The correlation in time may be a correlation in time between when the first and second data chunks were encoded In one or more embodiments, comparing the first source statistic to the second source statistic may comprise comparing frequencies of at least one of bits, bytes, and variable length sequences in the first and second data chunks.

In one or more embodiments, the first source statistic may a byte histogram. The byte histogram may correspond to frequencies of bytes. The first source statistic may alternatively or additionally be a bit histogram. The bit histogram may correspond to frequencies of bits. The first source statistic may also alternatively or additionally be a repetition of variable length sequences.

Various embodiments disclosed herein relate to a method. The method may comprise receiving a first encoded data chunk. The first encoded data chunk may be an ECC encoded data chunk. The first encoded data chunk may be stored in a plurality of memory cells that store encoded data chunks containing data generated by a plurality of application types. The first encoded data chunk may contain data generated by a first application type. The method may also comprise comparing a first source statistic for the first encoded data chunk to a plurality of classes of source statistics corresponding to data generated by a plurality of corresponding application types. The method may moreover comprise identifying a first class of source statistics that is positively correlated to the first source statistic. The first class of source statistics may be identified based at least in part on application type. The method may additionally comprise modifying decoder parameters. The decoder parameters may be ECC decoder parameters. The decoder parameters may be modified based on the first class of source statistics. The method may further comprise decoding the first encoded data chunk using the modified decoder parameters.

In one or more embodiments, identifying the decoder parameters may comprise computing a correlation of the first source statistic with a second source statistic for a second encoded data chunk. The second encoded data chunk may be a second ECC-encoded data chunk.

In one or more embodiments, the method may comprise encoding data written to the memory cells. The encoding may be ECC encoding. The method may also comprise determining the first source statistic during encoding of data to generate the first encoded data chunk.

In one or more embodiments, the first class of source statistics may be identified as being positively correlated to the first source statistic in response to a correlation between the first class of source statistics and the first source statistic satisfying a correlation threshold.

In one or more embodiments, the decoder parameters used to successfully decode a second encoded data chunk may be applied to the first encoded data chunk in response to determining that the correlation exceeds the correlation threshold.

In one or more embodiments, the first application type may generate data containing one or more types of data selected from a group consisting of text, images, videos, and audio.

BRIEF DESCRIPTION OF THE DRAWINGS

FIG. 10A depicts correlation between a representative data chunk with the data chunks from the sequential write of FIGS. 9A-D, according to one or more example embodiments.

FIG. 10B depicts correlation between a representative data chunks with the data chunks from the sequential write of FIGS. 9A-D, according to one or more example embodiments.

FIG. 12 provides simulation results illustrating enhanced decoding, according to one or more example embodiments.

Figure 1:
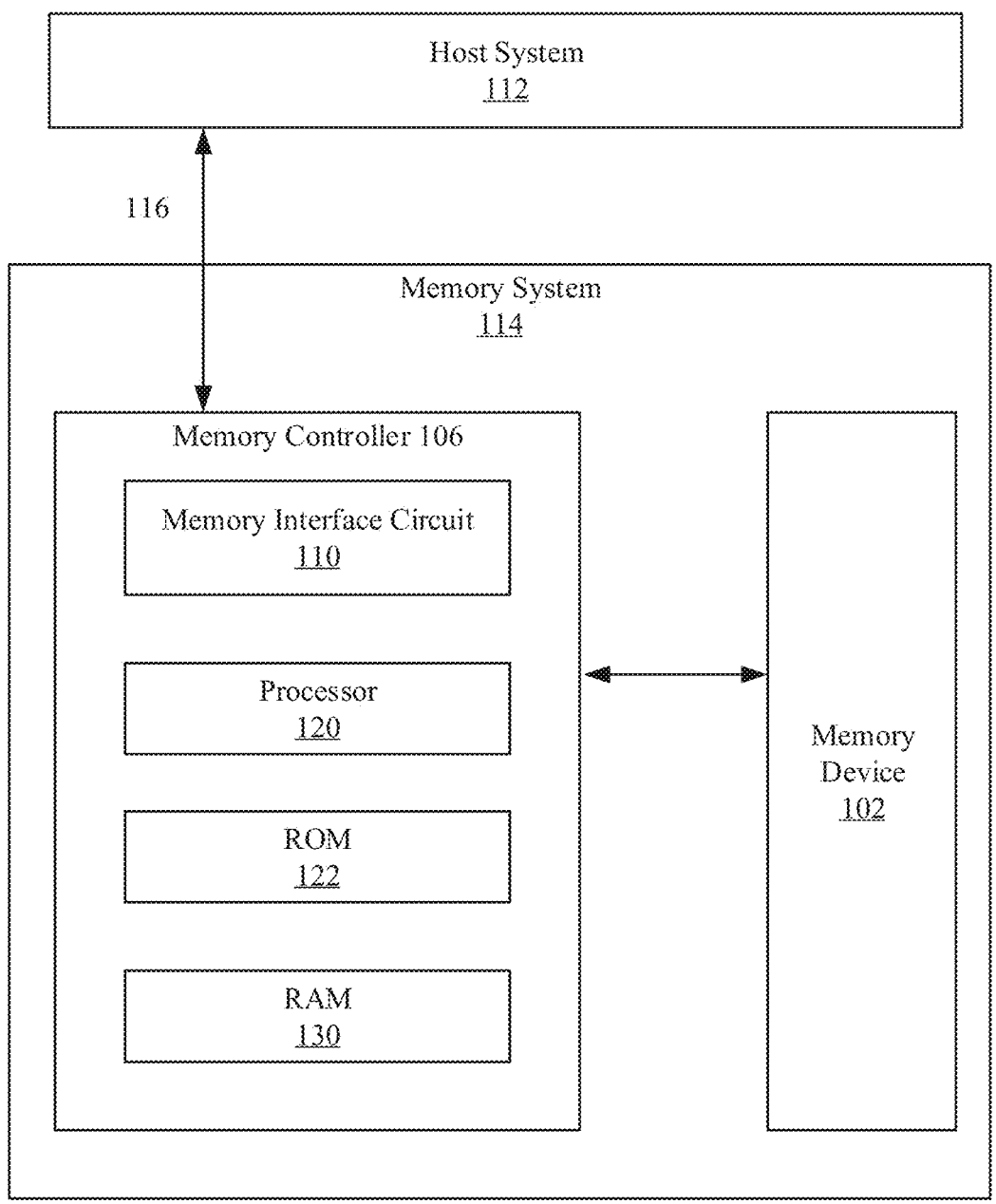
FIG. 1 is a block diagram of a computer system according to one or more example embodiments.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein are methods, devices, and systems for obtaining source statistics with high accuracy while maintaining high throughput by exploiting the correlation between data chunks. As a result, enhanced correction capability may be achieved, and decoding time and power consumption may be reduced. Decoding herein refers to converting data in encoded form into a decoded form. Examples of decoding include ECC (error correction code) decoding. Examples of encoding include ECC encoding.

In one aspect, a source statistic for a data chunk may be any data that characterizes the content (i.e., the data contained in) the data chunk. The source statistic may be based at least in part on patterns in the data, or may correlate with the likelihood that certain values are found in certain positions in the data chunk. Source statistics may characterize the manner and extent to which data in a data chunk is not uniformly distributed. Example attributes that may be tracked to learn source statistics include histograms and frequency of sequences of variable lengths. For example, a byte histogram may indicate a frequency for each of 256 possible bytes (in binary, from 00000000 to 11111111), suggesting that higher-frequency bytes are more likely than lower-frequency bytes, and that consequently, a bit correction that yields a higher-frequency byte is more likely to be accurate. A bit histogram may measure the probability of ones and zeros, and the frequency of sequences may identify repeating sequences such that a sequence of bits is more likely to be accurately corrected if the correction would yield a repeating sequence observed more frequently relative to a repeating sequence observed less frequently.

In another aspect, source statistics of a current data chunk are estimated for decoding, with higher accuracy and with decreased (or no) delays. Source statistics may be learned from a different data chunk that was decoded and that has statistics that are highly correlated to the statistics of the current data chunk. The different data chunk may have been successfully decoded, but need not have been successfully decoded. Advantageously, source statistics can be learned from data chunks without decoding. In various implementations, source statistics learned from successfully-decoded data chunks may be more informative or more accurate. Data chunks with high correlation of their corresponding statistics can be found in different data chunks that were generated from the same source or application. These statistics may be used to adjust the decoder parameters and enhance decoder correction capability and reduce decoding latency and power consumption.

Figure 11B:
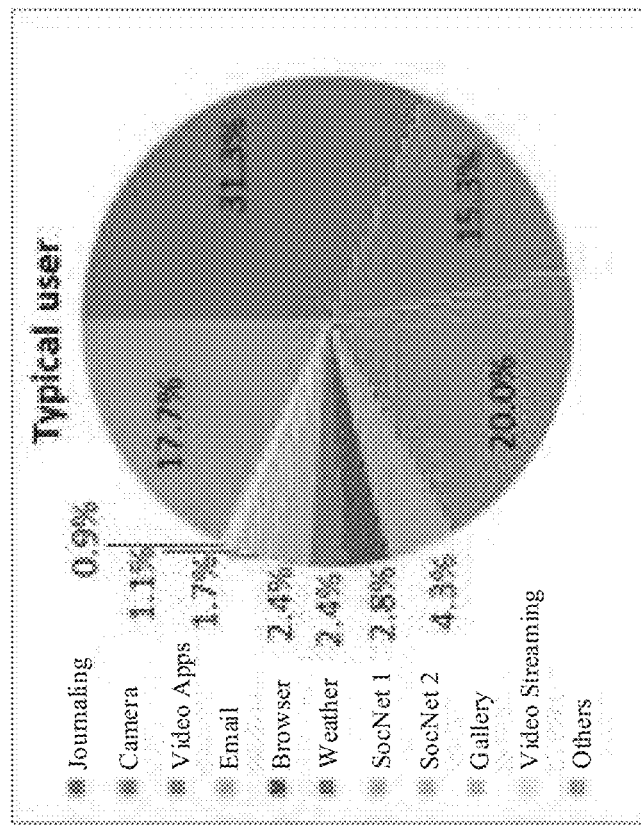
FIG. 11B represents various types of data that may be written to memory by a typical user, according to one or more example embodiments.
Figure 11A:
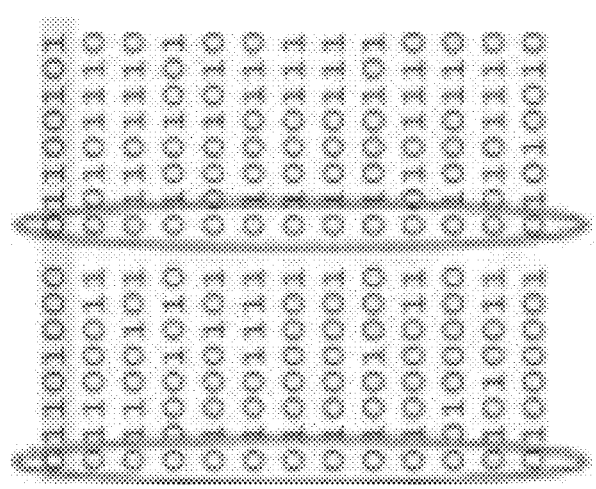
FIG. 11A represents data corresponding with a text file in ASCII that may be included in an encoded data chunk, according to one or more example embodiments.

Knowing the underlying statistics of encoded data helps improve the performance and correction capabilities of decoders. As an example of user information, a text file in ASCII is shown in FIG. 11A. Each character in ASCII is a byte, and the most common characters usually only occupy the seven least significant bits (LSBs) of the byte, leaving the most significant bit (MSB) with a value of zero (corresponding with the first columns circled in FIG. 11A). If an ECC decoder knows that the data are shaped as in, for example, FIG. 11A, such that the first bits are all zero (or otherwise more likely to be zero), the decoder could alter decoding parameters to reflect this shape. For example, the decoder could change the probability of the 1/0 distribution in every byte's MSB (such that the likelihood of the first bit having a value of 1 is zero or otherwise decreased), improving performance and correction capability.

Figures 9A, 9B:
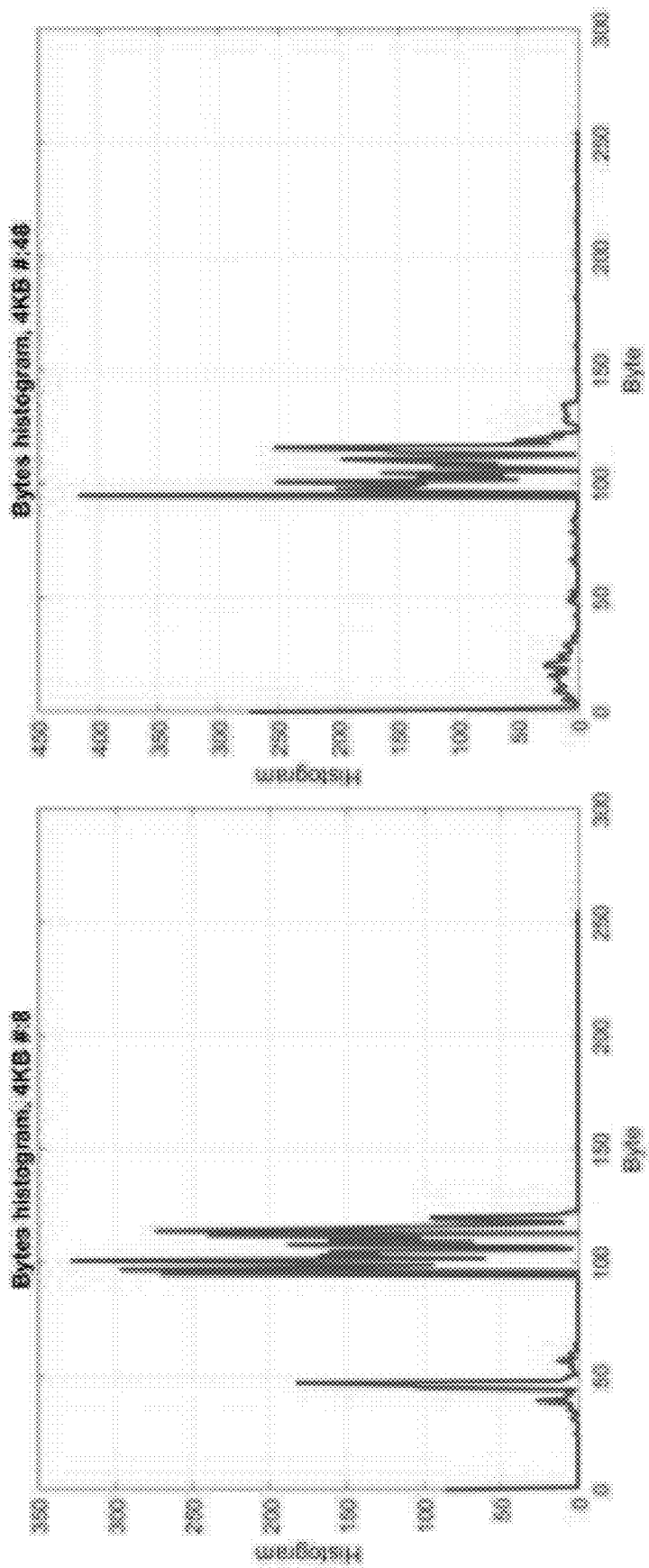
FIG. 9A depicts a sequential write recorded in a computing device, according to one or more example embodiments.
FIG. 9B depicts a sequential write recorded in a computing device, according to one or more example embodiments.
Figure 9D:
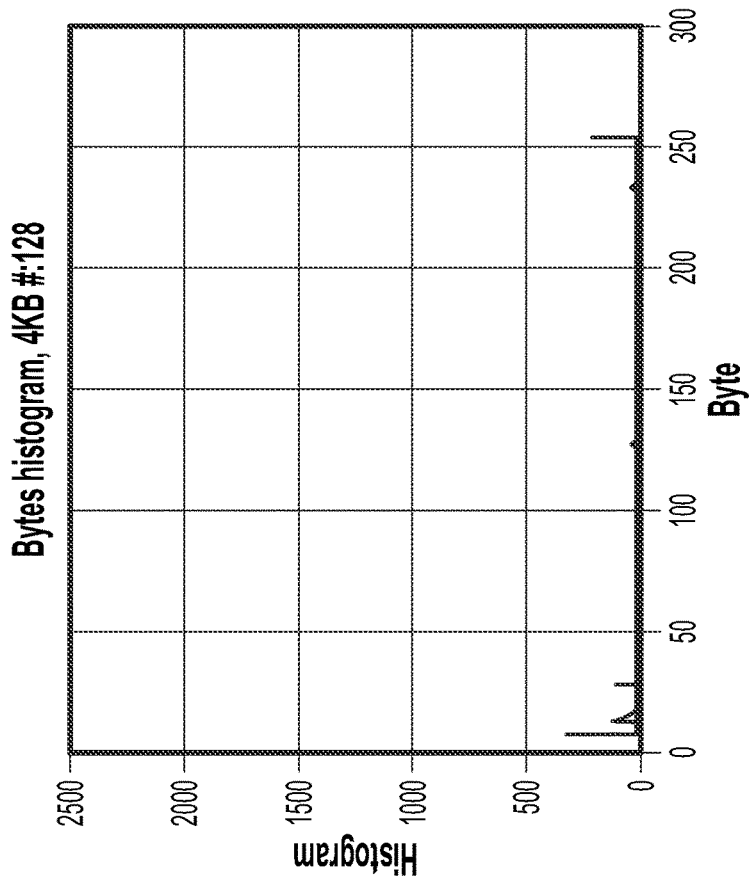
FIG. 9D depicts a sequential write recorded in a computing device, according to one or more example embodiments.
Figure 9C:
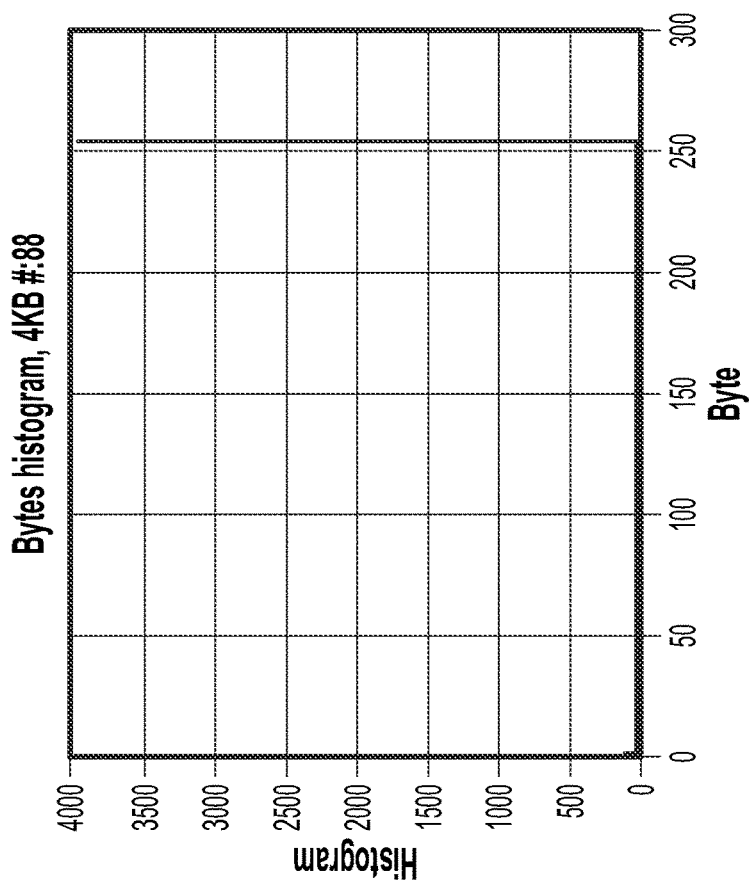
FIG. 9C depicts a sequential write recorded in a computing device, according to one or more example embodiments.

Without loss of generality, the option of using a byte histogram as source statistics will now be discussed in order to demonstrate the gain achievable in embodiments of the invention. With reference to FIGS. 9A-D, as an example, a sequential write command recorded in a computing device is illustrated. The sequential write illustrated here consists of 128 data chunks that are 4 kilobytes (KB) each. The byte histograms in FIGS. 9A-D show that bytes are not equally represented in the histogram and therefore hold valuable information to correcting other data chunks, which are correlative to them. As long as the source statistics are informative (e.g., non-uniform distribution for the byte-histogram case), the source statistics may be useful in correcting other data chunks. FIGS. 9A and 9B correspond to two data chunks (8 and 48) from text files. The data chunk in FIG. 9C is all (or nearly all) ones, as represented by the spike at byte 255 (i.e., 11111111), and the data chunk in FIG. 9D is mostly zeroes, as represented by the spike at byte 0 (i.e., 00000000). It is noted that data chunks can be similar and contextually correlated even though they were not adjacently written, as can be seen by the similar patterns of data chunk 8 (FIG. 9A) and 48 (FIG. 9B), which are 40 chunks apart. That is, data need not be sequential or correlated in time to be similar and thus able to inform and enhance decoding parameters.

Figure 10D:
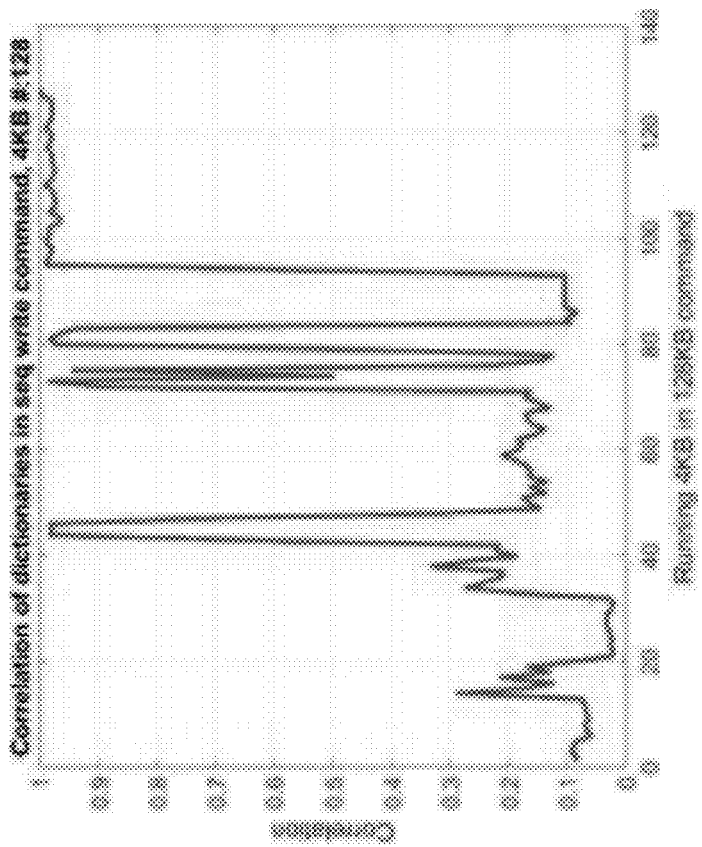
FIG. 10D depicts correlation between a representative data chunks with the data chunks from the sequential write of FIGS. 9A-D, according to one or more example embodiments.
Figure 10C:
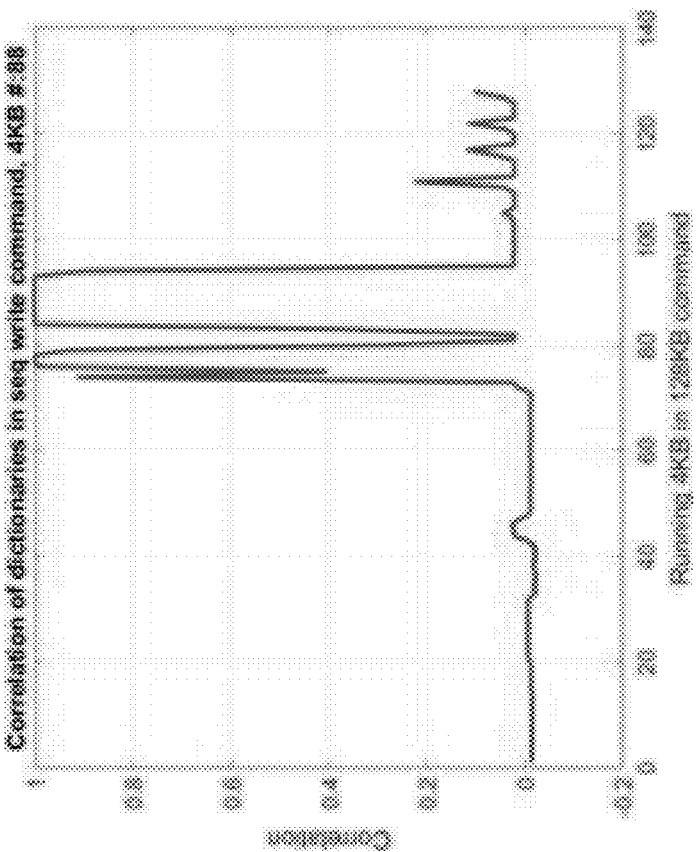
FIG. 10C depicts correlation between a representative data chunks with the data chunks from the sequential write of FIGS. 9A-D, according to one or more example embodiments.

FIGS. 10A-D show the correlation between four representative data chunks (8, 48, 88, and 128) and the entire 128 data chunks from the sequential write example of FIGS. 9A-D. That is, FIGS. 10A, 10B, 10C, and 10D provide the correlation (y-axis) of data chunks 8, 48, 88, and 128, respectively, with each of data chunks 1-128 (x-axis). In FIG. 10A, it can be seen that data chunk 8 has a correlation of 1 with data chunk 8, and is highly correlated with data chunks around data chunk 8 (e.g., data chunks ranging from about 5 to about 15), and is also highly correlated with data chunks ranging from about 50 to about 75. Similarly, in FIG. 10B, it can be seen that data chunk 48 has a correlation of 1 with data chunk 48, and is highly correlated with data chunks near 48 (e.g., data chunks ranging from about 48 to about 75), and is also highly correlated with data chunks ranging from about 1 to about 15. In FIG. 10C, it can be seen that data chunk 88 has a correlation of 1 with data chunk 88, and is highly correlated with data chunks near 88 (e.g., data chunks ranging from about 85 to about 95), and in FIG. 10D, it can be seen that data chunk 128 has a correlation of 1 with data chunk 128, and is highly correlated with data chunks near 128 (e.g., data chunks ranging from about 95 to about 128). These illustrate that data chunks from sequential writes may be highly correlated. The observed correlations in time (i.e., a byte histogram of the previous decoded data chunk is very similar to the byte histogram of current data chunk) can be used to increase the correction capability and reduce decoding latency and power consumption.

In addition to the correlation in time, the correlation between different data chunks can rely on the type of the data. There are various types of data that are written to the memory, as illustrated by the representative pie chart in FIG. 11B. Different types of data have different properties. However, different chunks of data from the same type have similar properties. In FIG. 11B, the data types identified are journaling, camera, video applications, email, browser, weather, social networking application 1, social networking application 2, gallery, video streaming, and others. For example, a data chunk with journaling data of a typical user is expected to have similar structure/statistics/properties as a different data chunk that also includes journaling data, but may be significantly different from data chunks with pictures data. Therefore, prior to decoding of a specific data chunk, the source statistics can be learned from other data chunks from the same type/application/user, and this information can be used to improve the correction capabilities of the current decoding attempt. As high correlations can be observed between two data chunks that are not consecutive in time but are data chunks from the same source or the same application, data chunks can be highly correlated even if data is read randomly.

FIG. 1 is a block diagram of a computer system 100, according to an example embodiment. The computer system 100 includes a memory system 114 operating according to commands from a host system 112. The computer system 100 can be any electronic device such as a personal computer, a server computer, a laptop, a smart phone, a tablet computer, a smart watch, etc. The memory system 114 communicates with the host system 112 (e.g., in some implementations, an operating system or application) through a host interface 116. The memory system 114 may be in the form of a removable memory such as a memory card or drive, or may be in the form of an embedded memory system.

The memory system 114 includes a memory device 102 and a memory controller 106. The memory controller 106 is a circuit that controls operations of the memory device 102, according to commands from the host system 112. The memory device 102 may comprise one or more arrays of memory cells distributed over one or more integrated circuit chips.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination thereof.

The memory device 102 can be formed from passive and/or active elements, in any combinations and may include a plurality of memory cells. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may contain memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over which the memory elements are formed or a layer in which the memory elements are formed. The substrate may also be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but covers all relevant memory structures within the spirit and scope as described herein.

The memory controller 106 controls operations of the memory device 102. In one embodiment, the controller 106 includes a memory interface circuit 110, a processor 120, read-only memory (ROM) 122, and random access memory (RAM) 130. In one aspect, ROM 122 and/or RAM 130 constitute a non-transitory computer readable medium that stores instructions that, when executed by the processor 120, cause the processor 120 to perform various functions disclosed herein. These components may be embodied as an application specific integrated circuit, field programmable gate array, other controller embodiments known to those of ordinary skill in the art, or a combination of one or more of these implementations.

The memory interface circuit 110 is a circuit that interfaces between the host system 112 and the memory device 102. In one configuration, the memory interface circuit 110 is coupled between the host system 112 and the memory device 102. In this configuration, the memory interface circuit 110 stores data at the memory device 102 or reads data from the memory device 102, according to a request from the host system 112.

For storing data, in response to a request from the host system 112 to store data, the memory interface circuit 110 stores the data at the memory device 102. The memory interface circuit 110 may encode the data and store the encoded data at the memory device 102. For reading data, in response to a request from the host system 112 to read data, the memory interface 110 retrieves the stored data from the memory device 102 and provides the retrieved data to the host system 112. The memory interface circuit 110 may decode the encoded data using a set of decoding parameters and provide the decoded data to the host system 112.

Figure 2:
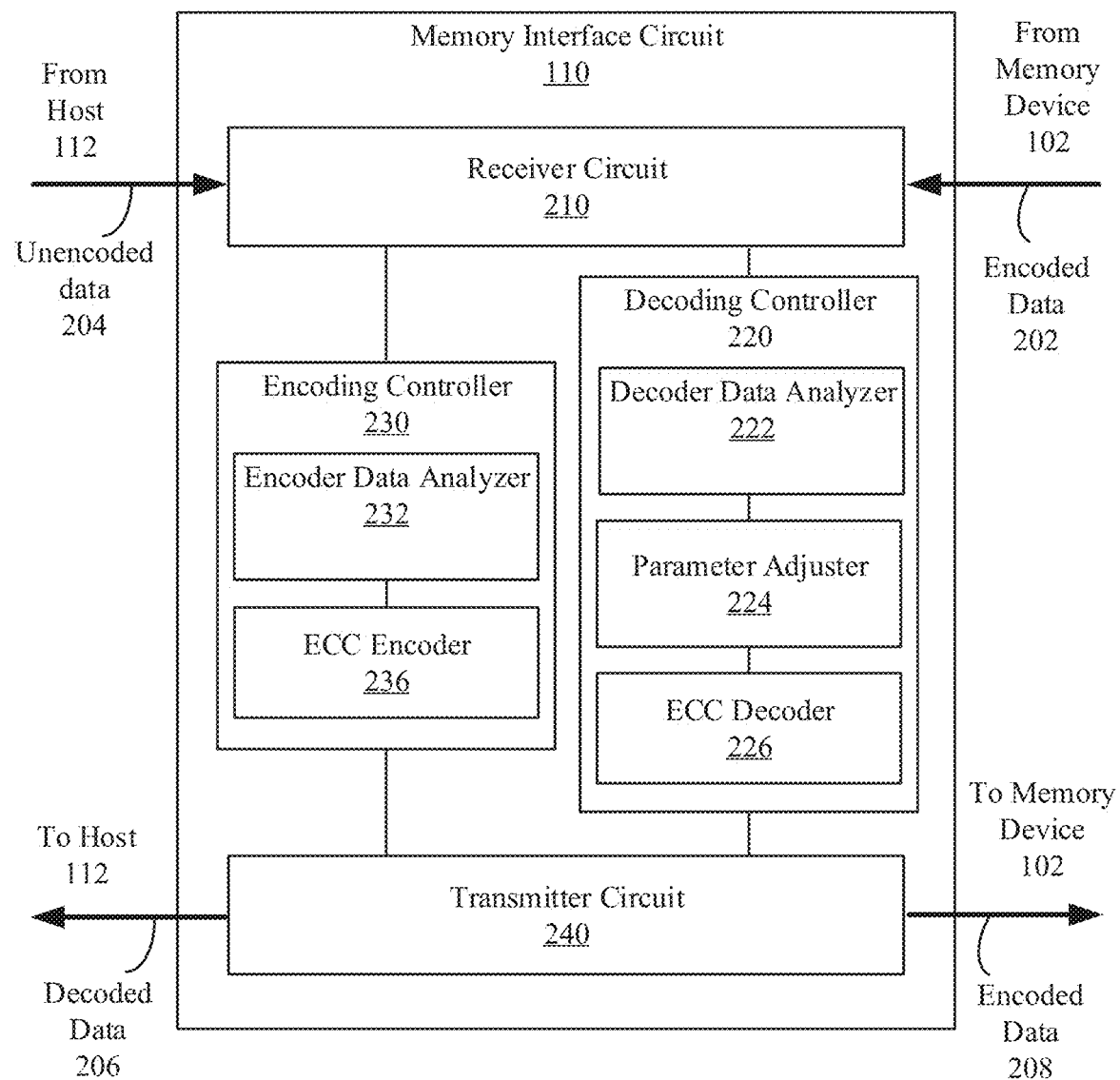
FIG. 2 is a memory interface circuit including a decoding controller, according to one or more example embodiments.

FIG. 2 is a memory interface circuit 110 according to an example embodiment. The memory interface circuit 110 includes a receiver circuit 210, a decoding controller 220, an encoding controller 230, and a transmitter circuit 240. These components operate together to store data in or read data from the memory device 102. These components may be embodied as application specific integrated circuit (ASIC), a field programmable gate array (FPGA), or a combination thereof. In other embodiments, the memory interface circuit 110 includes more, fewer, or different components than shown in FIG. 2.

The receiver circuit 210 may be any circuit configured to receive data and/or instructions from host 112, and/or receive data stored in memory device 102. In one configuration, the receiver circuit 210 is coupled to a plurality of memory cells of the memory device 102. In other embodiments, a receiver may be utilized in place of the receiver circuit 210. As used herein, a receiver may comprise any component, logic, circuit, or the like configured to receive data stored by one or more cells. In one embodiment, the receiver includes the receiver circuit 210. In another embodiment, two or more components may cooperate to serve as a receiver.

The receiver circuit 210 may receive a request from host 112 to read data stored in memory device 102. When data is to be read, an address identifying a location in memory device 102 from which data is to be read may be provided by host 112. In other embodiments, the data to be read is identified without providing an address, and the location in memory device 102 is determined by memory interface circuit 110 by, for example, cross-referencing a table providing addresses for particular data. The receiver circuit 210 may then retrieve the data 202, which may be stored in encoded form, and which may have bit flips, from one or more memory cells of memory device 102. The receiver circuit 210 may provide the encoded data 202 to the decoding controller 220 before the data is provided to host 112.

The receiver circuit 210 may also receive a request from host 112 to write data to memory device 102. The data 204 to be written may be provided by host 112 in un-encoded form. In some implementations, the location in memory device 102 at which the un-encoded data is to be stored may be determined by memory interface circuit 110 or, in other implementations, an address identifying a location in memory device 102 may be provided by host 112. The receiver circuit 210 may provide the un-encoded data 204 to the encoding controller 230 for encoding before being provided to memory device 102.

The decoding controller 220 is any circuit configured to receive the encoded data 202. In one configuration, the decoding controller 220 is coupled to the receiver circuit 210 and receives the encoded data 202 (which may be noisy data) from the receiver circuit 210. In one aspect, the decoding controller 220 determines which decoding parameters to use for decoding the encoded data 202 before starting to decode the encoded data 202. In one approach, the decoding controller 220 determines which decoding parameters to use based at least in part on characteristics of the data using decoder data analyzer 222. The characteristics of encoded data 202 may be based on, for example, the source of the data (e.g., the application that generated, or the device or user that provided, the data that was encoded to generate encoded data 202). In some implementations, source statistics can be used as metrics for characterizing data (such as patterns in the data that result when data are generated by the same application or are otherwise from the same source). The source statistics for data chunks can be compared with each other to identify suitable decoder parameters that can more efficiently and/or more accurately decode encoded data. The decoder data analyzer 222 is, in various embodiments, configured to determine source statistics and compare the source statistics of data chunks to determine correlations between data chunks.

Based on the correlation between data chunks, decoder parameters to be used to decode encoded data can be adjusted by parameter adjuster 224. In some embodiments, if a positive correlation is found between a current chunk of data to be decoded and another data chunk, the decoder parameters can be adjusted to align or otherwise correspond to the decoder parameters suited to the other data chunk. The decoding controller 220 may provide the encoded data 202 to an ECC decoder 226 for decoding using the adjusted parameters set by the parameter adjuster 224.

The ECC decoder 226 is any circuit configured to perform decoding according to decoding parameters (and/or other decoding configuration data) from the decoding controller 220. In one configuration, the ECC decoder 226 is coupled to the parameter adjuster 224 and/or the decoder data analyzer 222. As used herein, a decoder may comprise any component, logic, circuit, or the like configured to perform decoding according to decoding configuration data. In another embodiment, two or more components may cooperate to serve as a decoder. The ECC decoder 226 receives the encoded data 202 and the decoding configuration data from the parameter adjuster 224, and decodes the encoded data 202 according to the decoding configuration data. In some embodiments, the ECC decoder 226 is a means for decoding data according to the statistics of the encoded data. In one aspect, the decoding configuration data is indicative of statistics of the encoded data, where the statistics are correlated to content (e.g., what is contained in) or a type (or other characteristics) of data encoded. Hence, the ECC decoder 226 may perform content-aware decoding by decoding the encoded data 202 according to decoding configuration data that is based on characteristics of the data.

The encoding controller 230 is any circuit configured to receive the un-encoded data 204. In one configuration, the encoding controller 230 is coupled to the receiver circuit 210 and receives the un-encoded data 204 from the receiver circuit 210. In one aspect, the encoding controller 230 identifies characteristics of data. The characteristics may be determined by an encoder data analyzer 232. The characteristics may be source statistics that serve as metrics for characterizing data (such as patterns in the data that result when data are generated by the same application or are otherwise from the same source).

An ECC encoder 236 is any circuit configured to encode data according to ECC encoding parameters or other encoder configuration data. In one configuration, the ECC encoder 236 is coupled to the encoder data analyzer 232. As used herein, an encoder may comprise any component, logic, circuit, or the like configured to perform encoding according to encoding configuration data (which may be provided by, e.g., encoding controller 230). In another embodiment, two or more components may cooperate to serve as an encoder. The ECC encoder 236 receives the un-encoded data 204 and encodes the un-encoded data 204 according to the encoding parameters. In various approaches, the encoder data analyzer 232 identifies characteristics of un-encoded data 204 prior to, during, or after the un-encoded data 204 is encoded by ECC encoder 236.

The transmitter circuit 240 is any circuit configured to transmit data to the host 112 or to the memory device 102. In one configuration, the transmitter circuit 240 is coupled to the decoding controller 220 and the encoding controller 230. In other embodiments, a transmitter may be utilized in place of the transmitter circuit 240. As used herein, the transmitter may comprise any component, logic, circuit, or the like configured to transmit data to the host 112 (e.g., as part of a read operation) or to the memory device 102 (e.g., as part of a write operation). In one embodiment, the transmitter includes the transmitter circuit 240. In another embodiment, two or more components may cooperate to serve as a transmitter. The transmitter circuit 240 can receive decoded data from the decoding controller 220 and transmit the decoded data 206 to the host 112, and can receive encoded data from the encoding controller 230 and transmit the encoded data 208 to the memory device 102.

Figure 3:
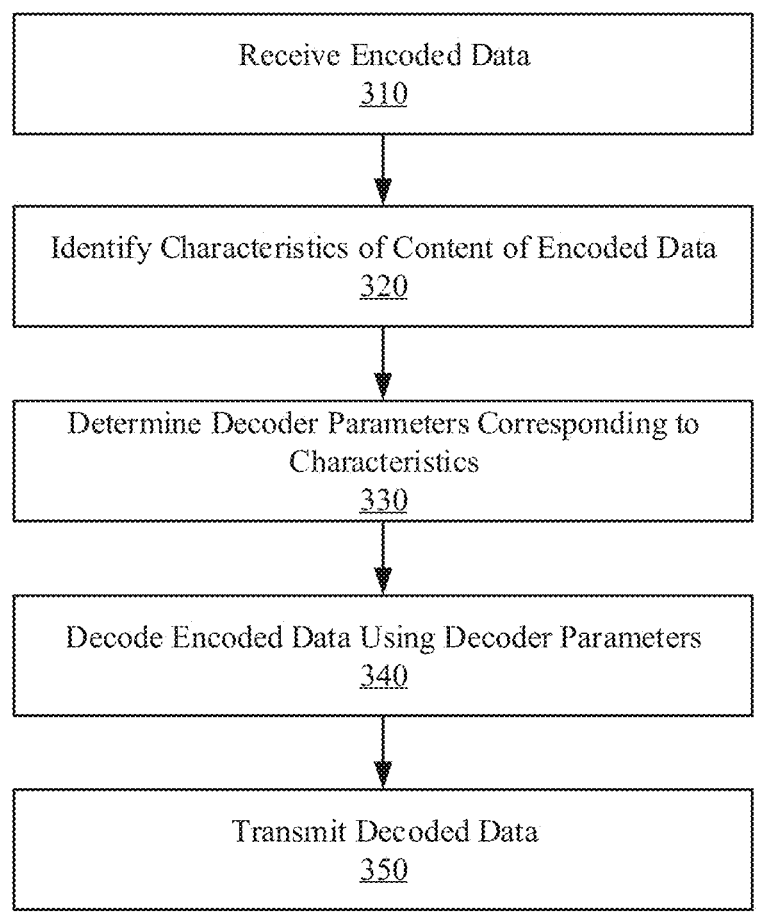
FIG. 3 is a flow chart illustrating a process of decoding encoded data, according to one or more example embodiments.

FIG. 3 provides a flow chart illustrating a process 300 of decoding encoded data, according to an example embodiment. In various implementations, process 300 may be performed by the memory interface circuit 110 of FIG. 2. In other embodiments, the process 300 may be performed by other components. In various implementations, the process 300 includes more, fewer, or different operations than shown in FIG. 3. At operation 310, encoded data is received. In some implementations, encoded data is received in chunks. The encoded data may be received by receiver circuit 210.

At operation 320, characteristics of the content of the data in the encoded data chunk are identified. In various embodiments, the characteristics of the data may be identified, at least in part, by the decoder data analyzer 222 after the decoding controller 220 receives encoded data 202 from receiver circuit 210. In other embodiments, characteristics of the data may alternatively or additionally be identified by encoder data analyzer 232 after the encoding controller 230 receives un-encoded data 204 from the receiver circuit 210 for encoding to generate the encoded data that may subsequently be received by the decoding controller 220 (potentially as noisy data) for decoding. In certain embodiments, characteristics may be identified by determining or categorizing a data type or an application, source, or user that generated the data in the encoded data chunk. In various versions, the data may be better understood by determining source statistics that characterize patterns in the data for the data chunk. In some implementations in which source statistics are to be collected during the encoding, the un-encoded data can be divided into T different data types/data classes. For each class, the source statistics from different data chunks from the same class can be averaged and saved in memory device 102 or in RAM 130 for later use (e.g., for when a data chunk from this type/class is to be decoded). In certain implementations in which source statistics are to be collected from the noisy read data (without decoding), the source statistics of data chunks of the same data type can be averaged to significantly reduce the noise level. In example implementations, source statistics may be learned from data chunks (of the same type as the current data chunk) that were previously decoded successfully.

At operation 330, decoder parameters suited to a data chunk with the characteristics identified at operation 320 are determined. In various embodiments, the decoder parameters may be determined by the decoder data analyzer 222 after source statistics are determined. In various embodiments, the decoder parameters may be determined at least in part by computing one or more correlations of the source statistics for the current data chunk with source statistics for one or more other data chunks. In some implementations, the most highly (positively) correlated data chunk is identified. In certain implementations, the highest correlation is compared with a threshold correlation to determine whether the most highly-correlated data chunk is sufficiently correlated. In various versions, if a correlation that is high enough is found, the decoder parameters for the sufficiently-correlated data chunk may be deemed to be the decoder parameters for the current encoded data chunk to be decoded.

In various implementations, the correlation coefficient between source statistics of different data chunks is defined by the following formula (Eq. 1), where x is a source statistic for data chunk X, and y is a source statistic for data chunk Y:

$$c_{xy} = \frac{R_{xy}}{\sqrt{R_{xx}R_{yy}}}$$

In certain implementations in which byte histograms are used as source statistics, $A_i$ and $B_i$ can be defined as the byte histograms for two different data chunks, where i=0, ... 255. The correlation coefficient $c_{xy}$ may then be calculated as (Eq. 2):

$$c_{xy} = \frac{\Sigma_{i=0}^{255} Ai \cdot Bi}{\sqrt{\Sigma_{i=0}^{255} Ai^2 \cdot \Sigma_{i=0}^{255} Bi^2}}$$

In Eq. 2, $c_{xy}$ can be used as a measure that quantifies the correlation of the source statistics between two or more data chunks.

At operation 340, the encoded data chunk is decoded using the decoder parameters determined at operation 330. In various embodiments, the encoded data is decoded using parameter adjuster 224 and ECC decoder 226 of decoding controller 220. For example, the parameter adjuster 224 may modify or set the decoder parameters to be the decoder parameters determined based on the characteristics of data in the encoded data chunk being decoded. The decoder parameters modified or set by parameter adjuster 224 may then be used by ECC decoder 226 to decode the encoded data chunk. At operation 350, the decoded data may be transmitted. In various embodiments, the decoded data is transmitted by transmitter circuit 240. For example, the decoded data chunk may be transmitted as decoded data 206 to host 112.

Figure 4:
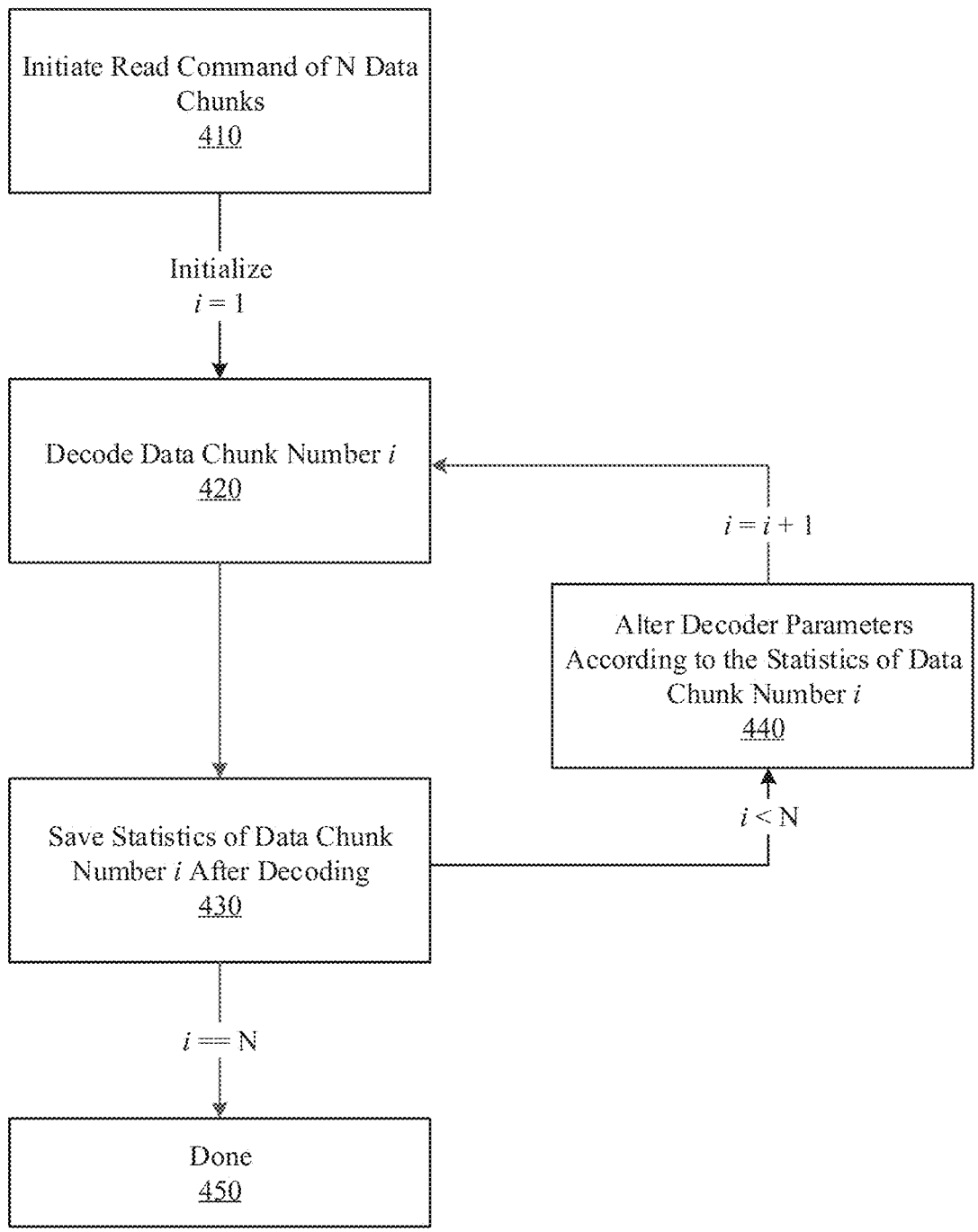
FIG. 4 is a flow chart illustrating a process for enhanced decoding, according to one or more example embodiments.

FIG. 4 is a flow chart illustrating a process 400 for enhanced decoding according to example embodiments. As noted, many different data chunks may have source statistics that are highly correlated to each other. In various implementations, the source statistics of a previous data chunk may be used in order to alter the decoder parameters for the next data chunk, as illustrated in FIG. 4. The process 400 may be performed by the memory interface circuit 110 of FIG. 2. In other embodiments, the process 400 may be performed by other entities. In various embodiments, the process 400 includes more, fewer, or different operations than shown in FIG. 4.

At operation 410, a read command of N data chunks is initiated. In various embodiments, the reads may be sequential. In other embodiments, the reads may be random or otherwise non-sequential. The statistics of data chunk i may be useful for decoding data chunk i+1 for sequential and non-sequential reads. In certain embodiments, operation 410 may be performed by receiver circuit 210 in response to a command, for example, that is sent by the host 112 to the memory interface circuit 110. The host 112 may, for example, transmit instructions to the receiver circuit 210 to read certain data in memory device 102. The instructions from the host 112 may include an address or other information that allows the memory interface circuit 110 to identify the data to be read (and/or its location in memory device 102). In some implementations, once the instructions are received from the host 112, the receiver circuit 210 or another component of the memory interface circuit 110 may determine how the data should be read from memory device 102, such a size and number (i.e., N) of data chunks to be read. In some implementations, the data chunks have a default size (e.g., 4 KB), while in other implementations, the size is determined dynamically based on the type and quantity of data to be read from the memory device 102. The receiver circuit 210 (or another component of memory interface circuit 110) may then set a value for i to be 1, and sequentially read the data chunks from 1 to N.

At operation 420, data chunk i is decoded. In some implementations, receiver circuit 210 provides data chunk i to decoding controller 220 for decoding by ECC decoder 226. In various embodiments, for the first data chunk (i.e., i=1), source statistics of data chunk i (before decoding) may be determined using decoder data analyzer 222. The source statistics may then be compared with source statistics of one or more reference source statistics that are representative of data chunks containing known data types. If source statistics for data chunk i are correlated with source statistics of a reference data chunk, the parameter adjuster 224 may alter the decoder parameters to the parameters corresponding with the most-correlated reference data chunk. In certain implementations, for the first data chunk (i.e., i=1), default decoder parameters may be used. In various implementations, the default decoder parameters may be, for example, decoder parameters recently used to decode data from a same or nearby memory cell of memory device 102. In certain implementations, decoder parameters may be determined based on which application is requesting data to be read. For example, if data is being requested via a word processor running on host 112, decoder parameters suited to text files may be used.

At operation 430, once data chunk i has been decoded, the source statistics for data chunk i, after decoding, may be determined and saved. In some implementations, the source statistics may be determined by decoder data analyzer 222 and saved at, for example, RAM 130 or memory device 102.

If i is less than N, at operation 440, the decoder parameters may be altered according to the source statistics of data chunk i. In some implementations, the parameter adjuster 224 alters the decoder parameters to parameters suited to the source statistics of data chunk i for use with decoding of subsequent data chunks. Then, one is added to i by, for example, the memory interface circuit 110 (e.g., by decoding controller 220).

At operation 420, with i having a value greater than one (i.e., after the first data chunk has been decoded), data chunk i is decoded using the decoder parameters as altered by parameter adjuster 224. In various implementations, each data chunk i is decoded using decoder parameters corresponding to the source statistics of the previous data chunk (i.e., data chunk i minus 1). At operation 430, the source statistics of decoded data chunk i (with values of 2 and higher) is saved for subsequent use. Operations 420, 430, and 440 proceed for values of i from 1 to N. Once i equals N, process 400 ends at 450.

Advantageously, with embodiments utilizing process 400 of FIG. 4, the learning of the source statistics of a specific data chunk, and altering of decoder parameters accordingly for the next data chunk, can be implemented on-the-fly during the decoding. Because altering the decoder parameters can be performed on-the-fly during the decoding, there will be no delays. In addition, because altering the decoder parameters achieves better performance, the decoding latency will be reduced.

In various alternative embodiments, a set (labeled T) of different classes of source statistics can be saved and used. For each class, there may be a representative source statistic (e.g., byte histogram). This representative source statistic can be, for example, an average of all the source statistics that were observed and are related to the specific class. This averaging can be performed during the encoding phase or the decoding phase. In various implementations, the average example can be further extended to cases in which moving averages are used, and the representative source statistics will be based on only the most recent source statistics. Moving average examples are further discussed below.

During decoding of a specific data chunk, attempts can be made to decode the data chunk according to the source statistics of a specific class from T. In case of a decode failure, a different class from T can be attempted until the data chunk has been decoded successfully. In certain implementations, correlation coefficients between the source statistics of the current data chunk (before decoding and with noise) and each one of the source statistics from the T classes of source statistics may be determined. This may yield, for example, a first correlation coefficient for the correlation between the current data chunk and a first class of source statistics from T, a second correlation coefficient for the correlation between the current data chunk and a second class of source statistics from T, and so forth. In various implementations, decoder parameters corresponding to the class from T with the highest correlation may be used. In some implementations, if all the correlations are too low (i.e., if none of the correlations exceeds a correlation threshold), default decoder parameters may be used to decode the current data chunk.

Figure 5:
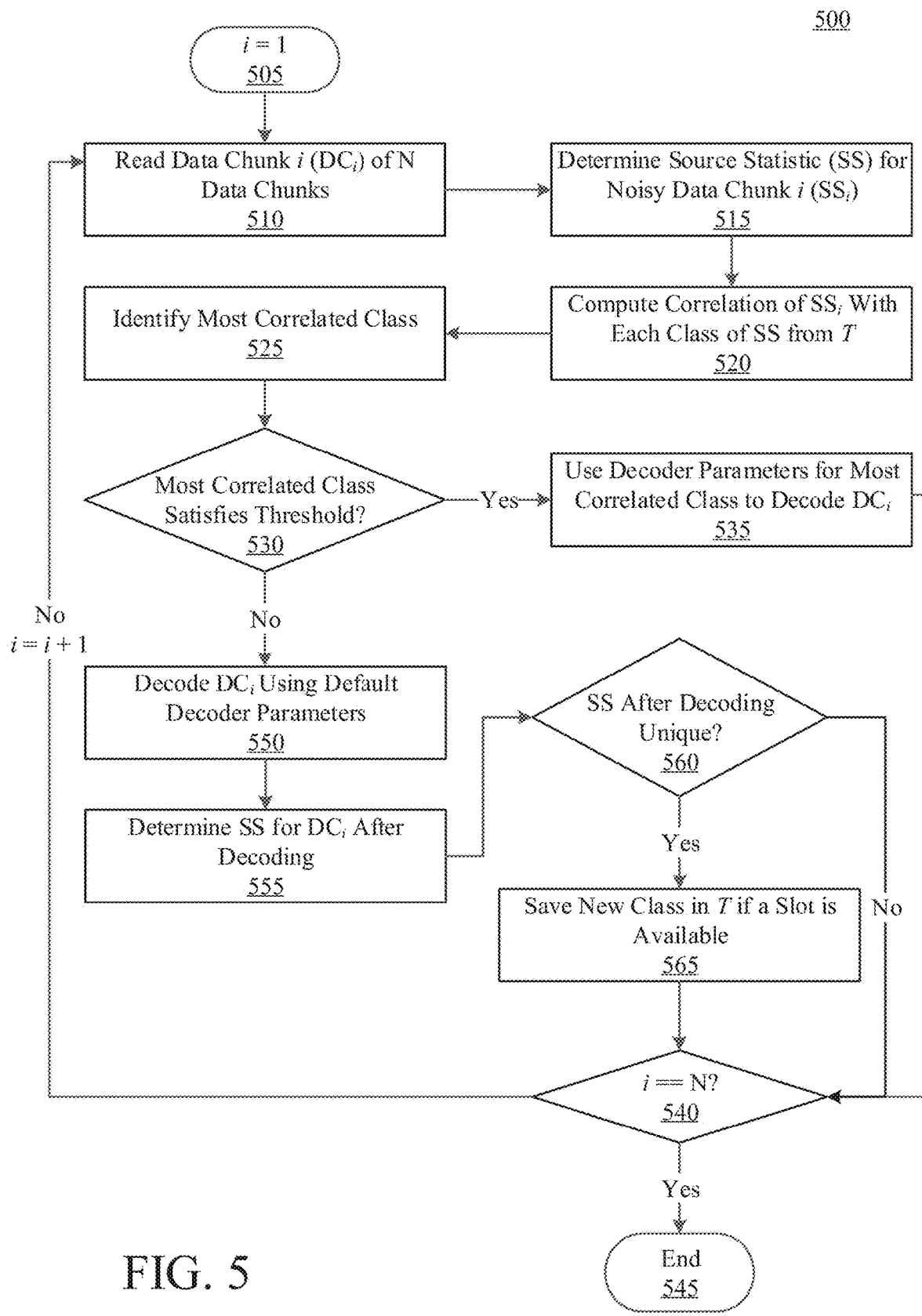
FIG. 5 is a flow chart illustrating a process for enhanced decoding, according to one or more example embodiments.

FIG. 5 is a flow chart illustrating a process 500 for enhanced decoding according to example embodiments utilizing a set T corresponding to different classes of source statistics. The process 500 may be performed by the memory interface circuit 110 of FIG. 2. In other embodiments, the process 500 may be performed by other entities. In various embodiments, the process 500 includes more, fewer, or different operations than shown in FIG. 5.

At operation 505, a value for i is set to 1. In some implementations, this may be performed by receiver circuit 210 or another component of memory interface circuit 110. At operation 510, data chunk i (abbreviated "$DC_i$" in FIG. 5) of N data chunks is read. Data chunk i may be read by, for example, receiver circuit 210. At operation 515, the source statistics (abbreviated "SS" in FIG. 5) for data chunk i (abbreviated "$SS_i$" in FIG. 5) may be determined. In various implementations, the source statistics are determined for the noisy (i.e., encoded data expected to have errors) data chunk i. In various implementations, operation 515 may be performed by decoder data analyzer 222 of decoding controller 220.

At operation 520, correlations of the source statistic of data chunk i with other source statistics (which may serve as, e.g., reference source statistics) can be computed. In various implementations, a set C of correlations is computed, with one correlation in set C for each class of source statistics in set T. In various implementations, the correlations are computed by decoder data analyzer 222 of decoding controller 220.

At operation 525, the most correlated class of source statistics is identified. In various implementations, the most correlated class of source statistics in set T has the highest corresponding correlation value in set C. In various implementations, operation 525 is performed by decoder data analyzer 222.

At operation 530, it may be determined whether the most correlated class is sufficiently correlated. In various implementations, operation 530 involves determining whether the class with the highest correlation has a correlation exceeding a correlation threshold. In certain implementations, operation 530 is performed by decoder data analyzer 222. In various embodiments, if the most correlated class has relatively little correlation, then the source statistics are not sufficiently similar. Example values for correlation thresholds, in various embodiments, may be, for example, 0.7, 0.8, etc. In some implementations, the correlation threshold may be based on the data being decoded and/or on prior correlations. For example, in some implementations, it may be determined that a certain correlation threshold (e.g., 0.9) is too high because too few source statistics are being found to be sufficiently correlated, and the correlation threshold may be reduced (to, e.g., 0.85) for attempting to decode subsequent data chunks.

At operation 535, if the most correlated class is sufficiently correlated, decoder parameters for the most correlated class may be selected for use in decoding data chunk i. Operation 535 may be performed by parameter adjuster 224 (which may modify the decoder parameters of ECC decoder 226 accordingly) and ECC decoder 226 (which may decode data chunk i using the decoder parameters as modified by parameter adjuster 224). Decoder parameters may include one or more parameter values, such as (among others) timeout parameter values, log likelihood ratio (LLR) values, decode mode parameter values, or a combination thereof.

At operation 540, after data chunk i has been decoded at operation 535, it may be determined whether i has reached N (i.e., whether any data chunks remain to be decoded). In various implementations, operation 540 may be performed by decoder data analyzer 222. If i has reached N, then process 500 may be ended at operation 545. If i has not reached N, then 1 is added to i and process 500 returns to operation 510.

At operation 550, if the most correlated class does not satisfy the correlation threshold at operation 530, then data chunk i may be decoded using default decoder parameters. In various implementations, this may be performed by ECC decoder 226. The default decoder parameters may be parameters that are intended to be generally suitable for decoding data chunks containing any (or a variety of) data types.

At operation 555, the source statistics for data chunk i may be determined. In various embodiments, the source statistics are determined after the data chunk i has been decoded using default parameters at operation 550. In various implementations, operation 555 may be performed by data analyzer 222.

At operation 560, it is determined whether the source statistics determined at operation 555 are not similar to one of the classes of source statistics in set T In various embodiments, the decoded data of data chunk is analyzed to determine whether the source statistics of the data chunk indicate that the data contained in the data chunk is different in type or otherwise unique in characteristics/patterns. In certain implementations, operation 560 may be performed by decoder data analyzer 222. In various embodiments, uniqueness may be determined by computing another set of correlations between the source statistics for data chunk i with the classes of source statistics in T, and if all correlations are below a minimum correlation threshold, then data chunk i may be deemed to have sufficiently dissimilar source statistics.

At operation 565, if it is determined at operation 560 that the source statistics of data chunk i are sufficiently unique, a new class of source statistics may be generated and saved in T In various implementations, the set T with the new class would be used for decoding of subsequent data chunks i. In certain embodiments, operation 565 may be performed by decoder analyzer 222. In some implementations, set T can contain a predetermined maximum number of values. For example, set T may only allow for a limited number of slots for different classes of source statistics. There is a tradeoff between the memory needed to be allocated in order to store the relevant data for the T classes (e.g., in RAM or in memory itself) and the ability to support many different classes.

If the source statistics for data chunk i are not determined to be sufficiently unique at 560, or after a new class in set T is saved at operation 565, it may be determined whether i has reached N (i.e., whether any data chunks remain to be decoded) at operation 540. If i has reached N, then process 500 may be ended at operation 545, or if i has not reached N, then 1 is added to i and process 500 returns to operation 510.

In alternative embodiments, the source statistics that are saved (e.g., at operation 430 in process 400 or operation 565 in process 500) can be changed using a moving average once a new decoded data chunk with the same statistics has been found. In various implementations, changing the saved source statistics can make the process more adaptive to changes and relax the pendency on a specific data chunk. Further, in various embodiments, the T classes can be determined during encoding where the source statistics for each data chunk are known. These T classes can be saved in memory device 102 and/or in 130 to be used to enhance the decoding of these data chunks, whether the data chunks are read sequentially (such as in process 400, for example) or randomly.

Figure 6:
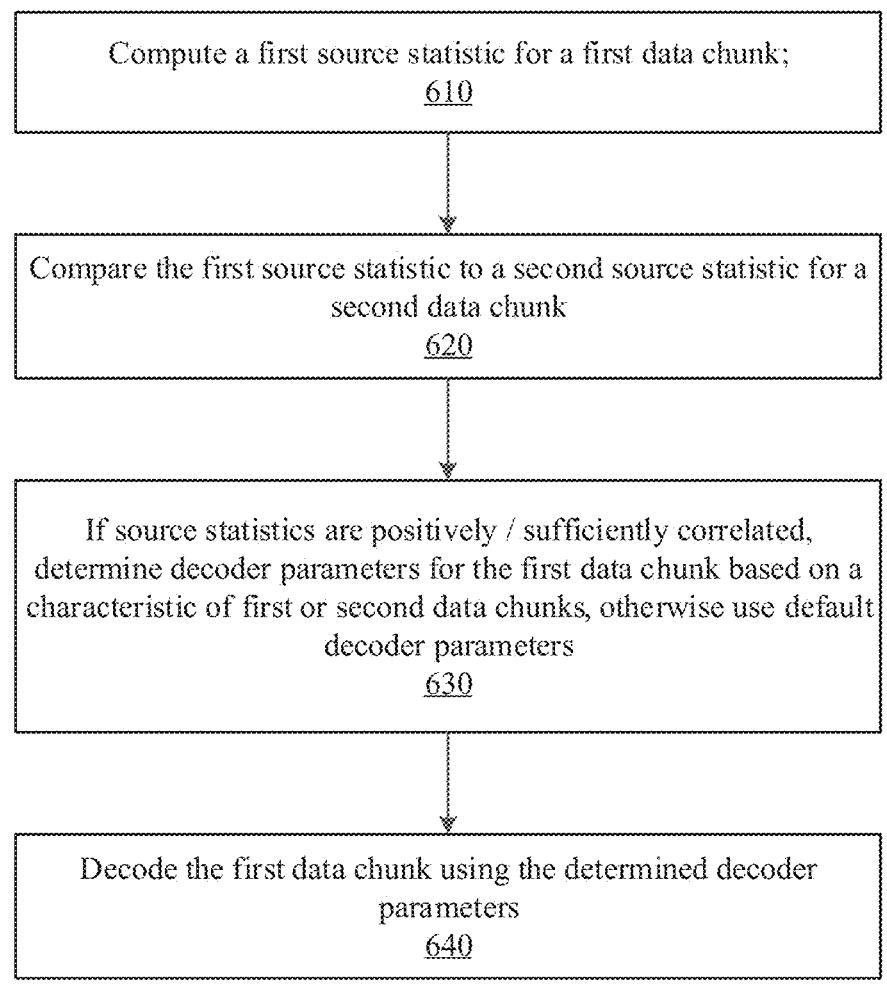
FIG. 6 is a flow chart illustrating a process for enhanced decoding, according to one or more example embodiments.

FIG. 6 is a flow chart illustrating a process 600 for enhanced decoding according to example embodiments. The process 600 may be performed by, for example, memory system 114 of FIG. 2. In other embodiments, the process 600 may be performed by other entities. In various embodiments, the process 600 includes more, fewer, or different operations than shown in FIG. 6.

At operation 610, a first source statistic is computed for a first data chunk. In various implementations, operation 610 may be performed by memory controller 106 or a component thereof (e.g., decoder data analyzer 222 of decoding controller 220). In different implementations, the first data chunk may be encoded (e.g., may contain encoded data 202) and may have been read (by, for example, receiver circuit 210) sequentially, randomly, or otherwise. At operation 620, the first source statistic computed at operation 610 is compared to a second source statistic for a second data chunk. In various implementations, operation 610 may be performed by decoding controller 220 or a component thereof (e.g., decoder data analyzer 222). In different implementations, the second source statistics may be source statistics representative of data of a certain type (e.g., data generated by a class of applications). In some implementations, the second data chunk is a previously-read and/or previously-decoded data chunk. In other implementations, the second data chunk is a reference data chunk used as a representative sample against which data chunks to be decoded are compared.

At operation 630, if the first and second source statistics are sufficiently (or "positively") correlated, then decoder parameters are determined for the first data chunk. In various implementations, operation 610 may be performed by memory controller 106 or a component thereof (e.g., decoder data analyzer 222 of decoding controller 220). In various implementations, a positive correlation between data chunks indicates that the data chunks have significant similarities. Similarities may be significant if, for example, comparable patterns and characteristics (resulting from, e.g., having a common source) could inform and enhance the decoding process. In certain embodiments, a positive correlation can be determined by computing a correlation c (using, e.g., Eq. 1) between the data chunks and determining whether the correlation exceeds a correlation threshold.

In various embodiments, decoder parameters for the first data chunk (i.e., the current data chunk to be decoded) may be determined based on a characteristic of the first or second data chunks. In certain implementations, the characteristic is a common data type/shared data source (e.g., a shared application or application type, user, or device that generated the data that was encoded to generate the encoded data chunk) that impart similarities between data chunks. In various implementations, the characteristic used to determine decoder parameters may be the source statistics (e.g., a byte histogram or other metrics) for one or both of the first and second data chunks. In certain implementations, because the characteristics of the first and second data chunks are similar (e.g., their source statistics are sufficiently correlated), the decoder parameters may be based on either the characteristic of the first data chunk or the second data chunk.

At operation 640, the first data chunk is decoded using the decoder parameters determined for the first data chunk at operation 630. In various implementations, operation 640 may be performed by decoding controller 220 or a component thereof (e.g., ECC decoder 226). In various implementations, the decoder parameters capable of successfully decoding the second data chunk may be used to decode the first (significantly similar) data chunk. In some implementations, the decoder parameters suitable for decoding a data chunk also may serve as a characteristic of the data chunk. If the source statistics of the first and second data chunks are not sufficiently correlated, default decoder parameters may be the decoder parameters determined to be the parameters that will be used to decode the first data chunk.

Figure 7:
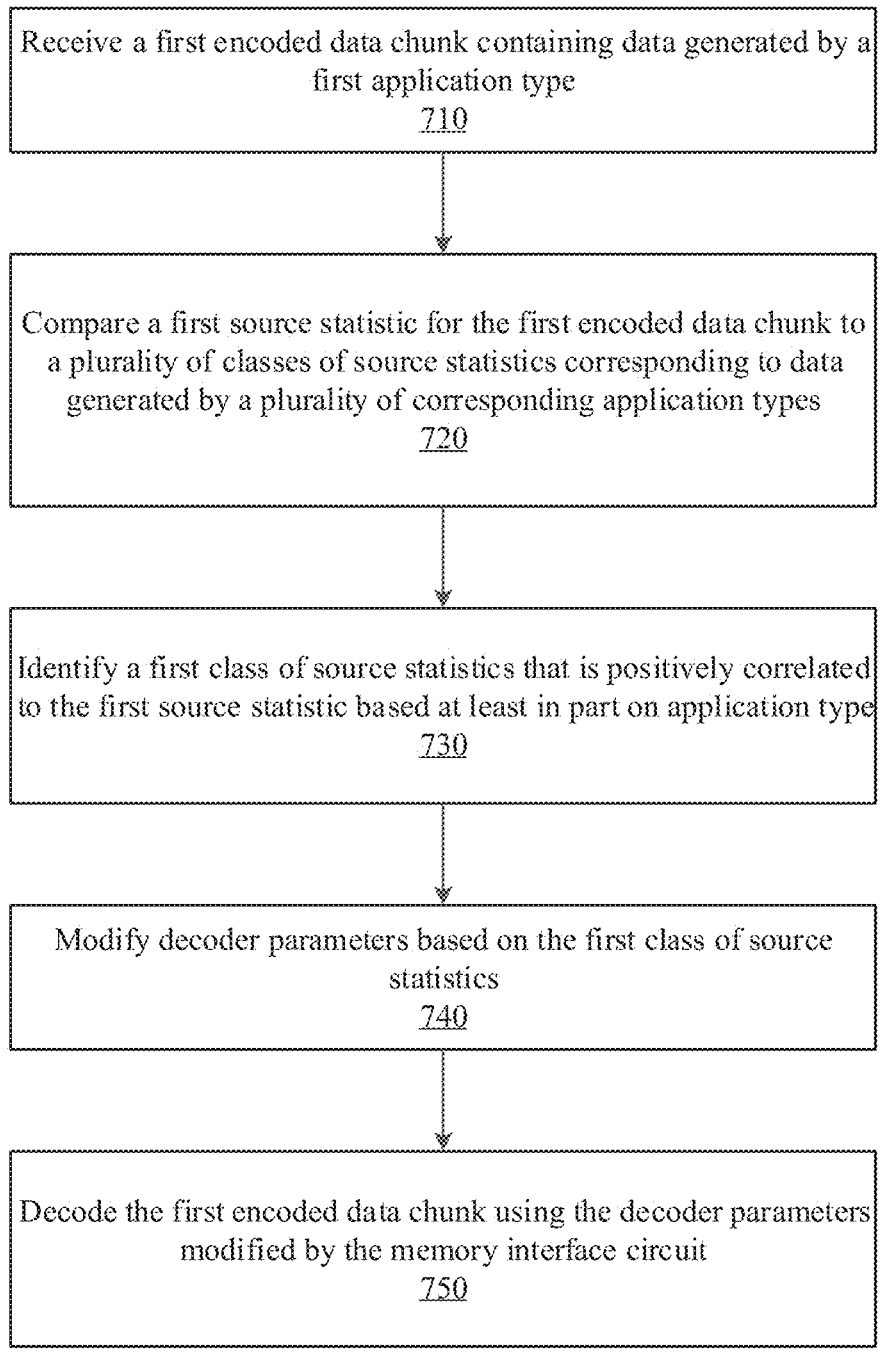
FIG. 7 is a flow chart illustrating a process for enhanced decoding, according to one or more example embodiments.

FIG. 7 is a flow chart illustrating a process 700 for enhanced decoding according to example embodiments. The process 700 may be performed by, for example, memory system 114 of FIG. 2. In other embodiments, the process 700 may be performed by other entities. In various embodiments, the process 700 includes more, fewer, or different operations than shown in FIG. 7.

At operation 710, a first encoded data chunk containing data generated by a first application type is received. In various implementations, operation 710 may be performed by memory interface circuit 110 or a component thereof (e.g., receiver circuit 210). In different implementations, the first encoded data chunk is stored in one or more memory cells of memory device 102, and the first encoded data chunk is encoded data 202.

At operation 720, a first source statistic for the first encoded data chunk is compared to a plurality of classes of source statistics corresponding to data generated by a plurality of corresponding source types. It is noted that, in certain embodiments, a specific application may generate multiple different sources. In various implementations, operation 720 may be performed by memory interface circuit 110 or a component thereof (e.g., decoder data analyzer 222 of decoding controller 220). In certain implementations, the classes of source statistics may be part of a set T of source statistic classes.

At operation 730, a first class of source statistics that is positively correlated to the first source statistic based at least in part on application type is identified. In various implementations, operation 730 may be performed by memory interface circuit 110 or a component thereof (e.g., decoder data analyzer 222 of decoding controller 220). In certain implementations, one or more correlations are computed, and correlations that are sufficiently high indicate, at least in part, that the data contained in the data chunks were generated by applications of the same type.

At operation 740, decoder parameters are modified based on the first class of source statistics. In various implementations, operation 740 may be performed by memory interface circuit 110 or a component thereof (e.g., parameter adjuster 224 of decoding controller 220). In various implementations, decoder parameters are modified so that they match decoder parameters suited to data chunks with source statistics in the first class of source statistics. At operation 750, the first encoded data chunk is decoded. In various implementations, operation 750 may be performed by memory interface circuit 110 or a component thereof (e.g., ECC decoder 226 of decoding controller 220). The first encoded data chunk may be decoded using the modified decoder parameters of operation 740.

Figure 8:
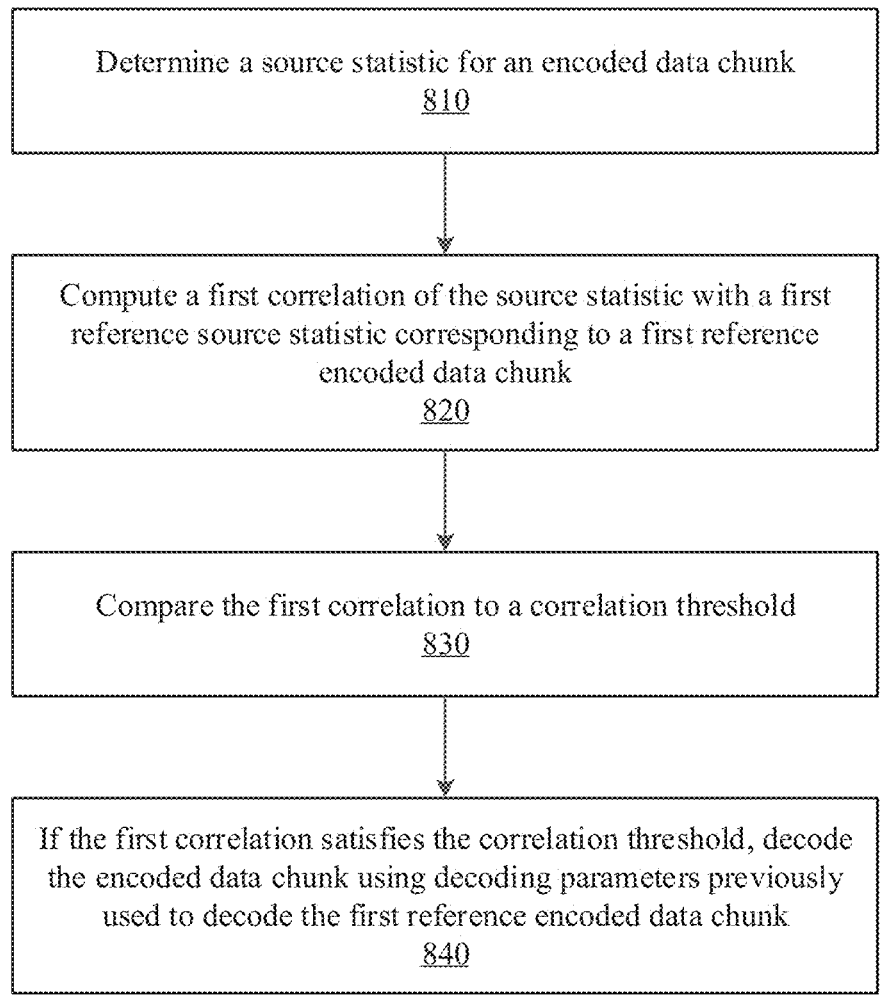
FIG. 8 is a flow chart illustrating a process for enhanced decoding, according to one or more example embodiments.

FIG. 8 is a flow chart illustrating a process 800 for enhanced decoding according to example embodiments. The process 800 may be performed by, for example, memory system 114 of FIG. 2. In other embodiments, the process 800 may be performed by other entities. In various embodiments, the process 800 includes more, fewer, or different operations than shown in FIG. 8.

At operation 810, a source statistic for an encoded data chunk is determined. In various embodiments, operation 810 may be performed by memory interface circuit 110 or a component thereof (e.g., decoder data analyzer 222 of decoding controller 220). In certain implementations, the memory interface circuit 110 or a component thereof is a means for determining a source statistic for an encoded data chunk. In some implementations, the decoder data analyzer 222 of decoding controller 220 is a means for determining a source statistic for an encoded data chunk. At operation 820, a first correlation of the source statistic with a first reference source statistic corresponding to a first reference encoded data chunk is computed. In various embodiments, operation 820 may be performed by memory interface circuit 110 or a component thereof (e.g., decoder data analyzer 222 of decoding controller 220). In certain implementations, the memory interface circuit 110 is a means for computing a first correlation of the source statistic with a first reference source statistic corresponding to a first reference encoded data chunk. In some implementations, the decoder data analyzer 222 of decoding controller 220 is a means for computing a first correlation of the source statistic with a first reference source statistic corresponding to a first reference encoded data chunk. At operation 830, the first correlation is compared to a correlation threshold. In various embodiments, operation 830 may be performed by memory interface circuit 110 or a component thereof (e.g., decoder data analyzer 222 of decoding controller 220). In certain implementations, the memory interface circuit 110 is a means for comparing the first correlation to a correlation threshold. In some implementations, the decoder data analyzer 222 of decoding controller 220 is a means for comparing the first correlation to a correlation threshold. At operation 840, if it is determined that the first correlation satisfies the correlation threshold (e.g., the first correlation has a value exceeding a correlation threshold), the encoded data chunk may be decoded using decoding parameters previously used to decode the first reference encoded data chunk. In various embodiments, operation 840 may be performed by memory interface circuit 110 or components thereof (e.g., decoder data analyzer 222, parameter adjuster 224, and ECC decoder 226 of decoding controller 220). In certain implementations, the memory interface circuit 110 is a means for, in response to determining that the first correlation satisfies the correlation threshold, decoding the encoded data chunk using decoding parameters previously used to decode the first reference encoded data chunk. In some implementations, the decoder data analyzer 222, parameter adjuster 224, and ECC decoder 226 of decoding controller 220 are a means for, in response to determining that the first correlation satisfies the correlation threshold, decoding the encoded data chunk using decoding parameters previously used to decode the first reference encoded data chunk. In various implementations, the prior successful decoding of the reference data chunk makes it more likely that the current data chunk, if it has data of the same type or is otherwise sufficiently similar, can also be successfully decoded using the same decoder parameters. In certain implementations, the decoding process, even if it would otherwise be successful, would be more efficient with the decoder parameters suited to similar data chunks.

Figure 13:
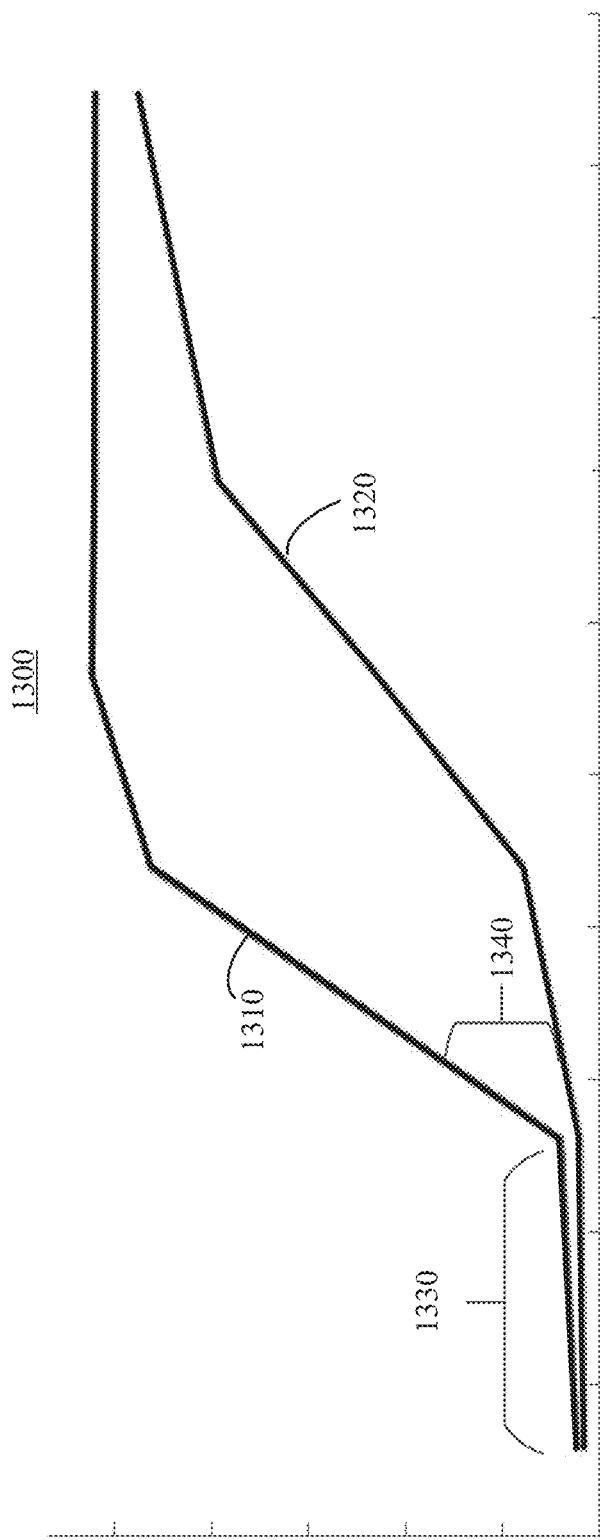
FIG. 13 provides simulation results illustrating enhanced decoding, according to one or more example embodiments.

FIGS. 12 and 13 correspond to illustrative depictions of representative improvements achievable using various embodiments of the enhanced decoders discussed herein. FIG. 12 demonstrates a relative improvement in correction capability. The illustrative x-axis of chart 1200 corresponds to the relative number of bit flips in a data chunk, and the illustrative y-axis corresponds to the relative decode success rate. Curve 1210 corresponds to the representative default decoder, without any knowledge of the source statistics. Curve 1220 corresponds to the representative case in which the decoder is genie-aided and knows the source statistics exactly for each data chunk. Curve 1230 corresponds to a representative enhanced decoder in which the decoder receives the statistics of correlated data chunks according to various embodiments discussed above. As can be seen in FIG. 12, curve 1230 representing the performance of embodiments of the enhanced decoder discussed here substantially coincides with or is otherwise comparable to the performance of the genie-aided algorithm. In chart 1200, the point at which the default decoder (curve 1210) is no longer able to decode successfully (where curve 1210 begins to overlap the x-axis), the enhanced decoder (curve 1230) maintains a relative decode success rate comparable to the genie-aided rate (curve 1220), as depicted by the dotted lines.

In FIG. 13, the relative improvement in decoding latency can be observed. The illustrative x-axis of chart 1300 corresponds to the relative number of bit flips in a data chunk, and the illustrative y-axis corresponds to the relative average decoding latency. Curve 1310 corresponds to the illustrative default decoder, without any knowledge of the source statistics, and curve 1320 corresponds to the illustrative case in which the decoder receives statistics of correlated data chunks. As can be seen from FIG. 13, even in region 1330, in which both the representative default decoder (1310) and the representative enhanced decoder (1320) decode with a high success rate, the enhanced decoder converges with a relatively lower latency (as represented by the vertical separation 1340 between curve 1310 and curve 1320).

Various embodiments discussed herein provide a storage system with improved endurance and reduced firmware overhead related to error handling. Improvements in decoding capabilities become more significant as the data becomes denser and the demands on storage devices grow.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system. While certain embodiments may be implemented in a controller, other embodiments may be implemented in a host system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A controller configured to:
   determine a first source statistic for a first data chunk;
   compare the first source statistic to a second source statistic for a second data chunk;
   in response to determining a positive correlation between the first source statistic and the second source statistic, determine decoder parameters for the first data chunk based on at least one of the first and the second source statistics; and
   decode the first data chunk using the determined decoder parameters;
   wherein the controller is configured to determine the decoder parameters for the first data chunk by, at least in part, identifying decoder parameters suited to the second data chunk in response to a determination that the first source statistic is positively correlated to the second source statistic;
   wherein to compare the first source statistic to the second source statistic, the controller is configured to, at least in part:
      compute a correlation coefficient between the first source statistic and the second source statistic,
      compare the correlation coefficient to a correlation threshold, and
      determine the first source statistic is positively correlated to the second source statistic in response to the correlation coefficient satisfying the correlation threshold.

2. The controller of claim 1, wherein the first data chunk and the second data chunk both include data of a first type, and wherein the first type corresponds to an application that generated the data.

3. The controller of claim 1, wherein the first data chunk corresponds to a first application and is of a first type, wherein the second data chunk corresponds to a second different application and is of the first type, and wherein the first type corresponds to a user that generated the data or to a file type.

4. The controller of claim 1, wherein the controller is configured to determine the first source statistic without decoding the first data chunk.

5. The controller of claim 1, wherein the controller is further configured to encode data to generate the second data chunk, and determine the second source statistic during encoding of the second data chunk.

6. The controller of claim 1, wherein the controller is configured to receive and decode the second data chunk prior to receipt and decoding of the first data chunk.

7. The controller of claim 1, wherein the controller is configured to select the second data chunk independent of a physical location of the second data chunk in a memory device.

8. The controller of claim 1, wherein the controller is configured to select the second data chunk independent of when the second data chunk was encoded relative to the first data chunk.

9. The controller of claim 1, wherein the controller is configured to determine the first source statistic based on a correlation in time between when the first data chunk and the second data chunk were encoded, and wherein the controller is further configured to modify the decoder parameters based on the correlation in time.

10. The controller of claim 1, wherein, to compare the first source statistic to the second source statistic, the controller is configured to, at least in part, compare frequencies of at least one of bits, bytes, and variable length sequences in the first and second data chunks.

11. The controller of claim 1, wherein the first source statistic is selected from a group consisting of a byte histogram corresponding to frequencies of bytes, a bit histogram corresponding to frequencies of bits, and a repetition of variable length sequences.

12. A method of decoding ECC encoded data, the method comprising:
   determining a source statistic for an encoded data chunk;

computing a first correlation of the source statistic with a first reference source statistic corresponding to a first reference encoded data chunk;

comparing the first correlation to a correlation threshold;

computing a second correlation of the source statistic with a second reference source statistic corresponding to a second reference encoded data chunk; and in response to determining that the first correlation satisfies the correlation threshold, decoding the encoded data chunk using decoding parameters previously used to decode the first reference encoded data chunk, wherein the encoded data is decoded using decoding parameters previously used to decode the first reference encoded data chunk when both (i) the first correlation satisfies the correlation threshold and (ii) the first correlation is greater than the second correlation.

* * * * *